(12) United States Patent
Lee et al.

(10) Patent No.: US 9,609,250 B2
(45) Date of Patent: Mar. 28, 2017

(54) UNIT PIXELS FOR IMAGE SENSORS AND PIXEL ARRAYS COMPRISING THE SAME

(71) Applicant: Samsung Electronics Co., Ltd., Suwon-si, Gyeonggi-do (KR)

(72) Inventors: Seung-Wook Lee, Yongin-si (KR); Yi-Tae Kim, Hwaseong-si (KR); Jung-Chak Ahn, Yongin-si (KR); Young-Woo Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 14/615,536

(22) Filed: Feb. 6, 2015

(65) Prior Publication Data

US 2016/0056200 A1   Feb. 25, 2016

(30) Foreign Application Priority Data

Aug. 19, 2014  (KR) .................... 10-2014-0107735

(51) Int. Cl.
*H01L 27/00* (2006.01)
*H04N 5/3745* (2011.01)
*H01L 27/146* (2006.01)

(52) U.S. Cl.
CPC ....... *H04N 5/3745* (2013.01); *H01L 27/1463* (2013.01); *H01L 27/1464* (2013.01); *H01L 27/14603* (2013.01); *H01L 27/14612* (2013.01); *H01L 27/14614* (2013.01); *H01L 27/14641* (2013.01); *H01L 27/14621* (2013.01); *H01L 27/14627* (2013.01)

(58) Field of Classification Search
CPC ................ H01L 27/1463; H01L 27/14641
USPC ..................................................... 250/208.1
See application file for complete search history.

(56) References Cited

U.S. PATENT DOCUMENTS

| | | | |
|---|---|---|---|
| 7,492,027 B2 | 2/2009 | Mouli | |
| 7,518,172 B2 | 4/2009 | Moon et al. | |
| 8,120,062 B2 | 2/2012 | Kim | |
| 8,338,295 B2 | 12/2012 | Lee et al. | |
| 8,390,089 B2 | 3/2013 | Chen et al. | |
| 8,497,561 B2 | 7/2013 | Mabuchi | |
| 8,564,085 B2 | 10/2013 | Kao et al. | |
| 8,576,311 B2 | 11/2013 | Okumura | |
| 8,610,810 B2 | 12/2013 | Shah et al. | |

(Continued)

FOREIGN PATENT DOCUMENTS

| | | |
|---|---|---|
| KR | 10-2010-0069936 A | 6/2010 |
| KR | 10-2013-0134791 A | 12/2013 |

*Primary Examiner* — Thanh Luu
(74) *Attorney, Agent, or Firm* — Myers Bigel, P.A.

(57) ABSTRACT

Provided are unit pixels for image sensors and pixel arrays including the same. The unit pixels include a first pixel including first and second photo diodes which are adjacent to each other, and a first deep trench isolation (DTI) fully surrounding sides of the first and second photo diodes and electrically separating the first pixel from other pixels adjacent to the first pixel. The first pixel includes a second DTI positioned between the first photo diode and the second photo diode and having one side formed to be spaced apart from the first DTI. The first pixel also includes a color filter positioned on the first and second photo diodes and fully overlapping the first and second photo diodes. The first pixel further includes a floating diffusion node electrically connected with the first and second photo diodes. The first and second photo diodes share one floating diffusion node.

19 Claims, 16 Drawing Sheets

(56) References Cited

U.S. PATENT DOCUMENTS

| | | | |
|---|---|---|---|
| 2011/0156186 A1* | 6/2011 | Iida | H01L 27/1463 |
| | | | 257/432 |
| 2012/0083066 A1 | 4/2012 | Kim | |
| 2013/0221410 A1 | 8/2013 | Ahn | |
| 2013/0249033 A1 | 9/2013 | Kim et al. | |
| 2013/0307040 A1 | 11/2013 | Ahn et al. | |
| 2013/0320407 A1 | 12/2013 | Ahn | |
| 2013/0321685 A1* | 12/2013 | Ahn | H04N 5/374 |
| | | | 348/308 |
| 2013/0329102 A1 | 12/2013 | Tsao et al. | |
| 2014/0327051 A1* | 11/2014 | Ahn | H01L 31/18 |
| | | | 257/228 |

\* cited by examiner

UNIT PIXELS FOR IMAGE SENSORS AND PIXEL ARRAYS COMPRISING THE SAME

CROSS-REFERENCE TO RELATED APPLICATION

This application claims priority from Korean Patent Application No. 10-2014-0107735 filed on Aug. 19, 2014 in the Korean Intellectual Property Office, and all the benefits accruing therefrom under 35 U.S.C. 119, the disclosure of which is incorporated by reference herein in its entirety.

BACKGROUND

An image capture device can include an image sensor. An image sensor is a semiconductor device that converts optical information into an electric signal. An image sensor may include a charge coupled device (CCD) image sensor and/or a complementary metal-oxide semiconductor (CMOS) image sensor. An image sensor may transmit the optical information converted into an electric signal to an image signal processor (ISP). A data interface device may be used while transmitting the optical information.

A CMOS image sensor may include a pixel array, a column selection circuit, a timing control circuit, a row scanning circuit, a column scanning circuit, a reference signal generator, a sampling circuit, and the like. In the pixel array, a plurality of pixels may be arranged in a matrix pattern. The respective pixels may be divided by being surrounded by deep trench isolation (DTI). Further, the respective pixels may include a plurality of photo diodes (PDs). However, an electrical crosstalk phenomenon in which a signal-to-noise ratio deteriorates due to the exchange of a carrier with another adjacent photodiode may occur in one photo diode. In this case, the DTI is formed among the plurality of photo diodes to reduce the crosstalk phenomenon. However, when the DTI is formed between the respective photo diodes, there can be a difficulty generating a contact connecting a floating diffusion node for each of the photo diodes.

SUMMARY

The present inventive concepts may provide unit pixels that can reduce a crosstalk phenomenon among a plurality of photo diodes included in a pixel which share a floating diffusion node or ground.

The present inventive concepts may also provide pixel arrays including unit pixels that can reduce a crosstalk phenomenon among a plurality of photo diodes included in a pixel which share a floating diffusion node or ground.

The present inventive concepts are not limited to the aforementioned embodiments, and other embodiments, which are not mentioned above, will be apparent to those skilled in the art from the following description.

According to an aspect of the present inventive concepts, unit pixels are provided including a first pixel including a first photo diode and a second photo diode which are adjacent to each other, and a first deep trench isolation (DTI) fully surrounding sides of the first and second photo diodes and electrically separating the first pixel from other pixels adjacent to the first pixel. The first pixel may include a second DTI positioned between the first photo diode and the second photo diode and having one side formed to be spaced apart from the first DTI, a color filter positioned on the first and second photo diodes and fully overlapping the first and second photo diodes, and a floating diffusion node electrically connected with the first and second photo diodes. The first and second photo diodes may share one floating diffusion node.

According to another aspect of the present inventive concepts, unit pixels are provided including a first photo diode and a second photo diode which are adjacent to each other, a pixel circuit disposed above the first and second photo diodes, a first DTI formed outside the first and second photo diodes, a second DTI positioned between the first photo diode and the second photo diode and formed to be spaced apart from the first DTI, and a color filter positioned below the first and second photo diodes. The color filter may be fully overlapped by the first and second photo diodes, and may transmit only light having a specific wavelength. The pixel circuit may include a first transfer transistor coupled to the first photo diode and positioned on the first photo diode, a second transfer transistor coupled to the second photo diode and positioned on the second photo diode, and a floating diffusion node coupled to both the first and second transfer transistors.

According to another aspect of the present inventive concepts, pixel arrays are provided including first pixels arranged in a matrix pattern, and second pixels adjacent to the first pixels. The first pixel may include a first photo diode and a second photo diode which are neighboring to each other, a first DTI fully surrounding a side of the first pixel and electrically separating the first pixel and the second pixel, a second DTI positioned between the first photo diode and the second photo diode and having one side formed to be spaced apart from the first DTI, a first color filter positioned on the first and second photo diodes and fully overlapping the first and second photo diodes, a first floating diffusion node electrically connected with the first and second photo diodes, and a first supplement transistor electrically connected to the floating diffusion node. The second pixel may include a third photo diode and a fourth photo diode which are neighboring to each other, a third DTI fully surrounding a side of the second pixel and electrically separating the first pixel and the second pixel, a fourth DTI positioned between the third photo diode and the fourth photo diode and having one side formed to be spaced apart from the third DTI, a second color filter positioned on the third and fourth photo diodes and fully overlapping the third and fourth photo diodes, a second floating diffusion node electrically connected with the third and fourth photo diodes and electrically connected with the first floating diffusion node, and a second supplement transistor electrically connected to the second floating diffusion node. The second color filter may have a different color from the first color filter.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF THE EMBODIMENTS

Figure 1:
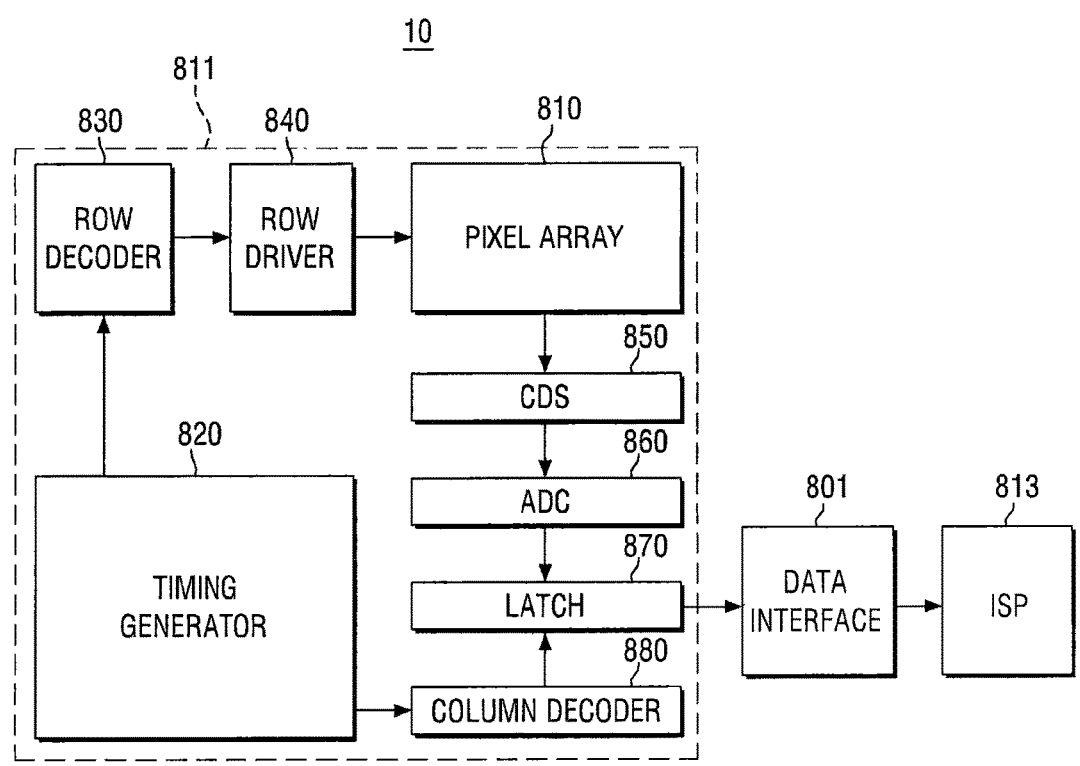
FIG. 1 is a block diagram of image capture devices according to embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the present inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, unit pixels for image sensors and pixel arrays including the same according to some embodiments of the present inventive concepts will be described with reference to FIGS. 1 to 16.

FIG. 1 is a block diagram of image capture devices according to embodiments of the present inventive concepts.

Referring to FIG. 1, the image capture device 10 according to embodiments of the present inventive concepts may include an image sensor 811 and an image signal processor 813. The image sensor 811 may include an active pixel sensor array 810 (hereinafter, referred to as a pixel array) in which pixels including a photoelectric conversion element are arranged in two dimensions, a timing generator 820, a row decoder 830, a row driver 840, a correlated double sampler (CDS) 850, an analog to digital converter (ADC) 860, a latch 870, a column decoder 880, and the like.

The pixel array 810 may include a plurality of unit pixels arranged in two dimensions. The plurality of unit pixels may serve to convert an optical image into an electric output signal. The pixel array 810 may be driven by receiving a plurality of driving signals including a row selection signal, a reset signal, a charge transmission signal, and the like from the row driver 840. Further, the converted electric output signal may be provided to the correlated double sampler 850 through a signal line.

The pixel array 810 may include a CMOS type image pixel. The pixels arranged in the pixel array 810 may be arranged in a Bayer pattern or in a chess mosaic pattern. When a Bayer pattern technology is adopted, active pixels in the pixel array 810 may be arranged to receive red light, green light, and blue light, respectively. However, the present inventive concepts are not limited thereto and configurations for a plurality of active pixels arranged in the pixel array 810 may be modified in any degree. For example, in some other embodiments of the present inventive concepts, the plurality of active pixels arranged in the pixel array 810 may be arranged to receive magenta (Mg) light, yellow (Y) light, cyan (Cy) light, and/or white (W) light.

The timing generator 820 may provide a timing signal and a control signal to the row decoder 830 and the column decoder 880.

The row driver 840 may provide to the active pixel sensor array 810 a plurality of driving signals for driving the plurality of unit pixels according to a result decoded by the row decoder 830. In general, when the plurality of unit pixels are arranged in the matrix pattern, the driving signal may be provided for each row.

The correlated double sampler 850 may receive an output signal formed in the active pixel sensor array 810 through the signal line in order to hold and sample the received output signal. That is, a signal level by the output signal and a specific noise level may be doubly sampled in order to output a difference level corresponding to a difference between the noise level and the signal level.

The analog-to-digital converter 860 may convert an analog signal corresponding to the difference level into a digital signal, and may output the converted digital signal.

The latch 870 may latch the digital signal, and may transmit the latched signal to the image signal processor (ISP) sequentially according to the result decoded by the column decoder 880.

The image signal processor 813 may adjust a gain correction of the quality of light or a white balance, for the electric signal output from the image sensor 811. The image signal processor 813 may receive exposure data (that is, an image signal) of a captured image, and may remove noise included in the received image signal through the correction.

A data interface 801 may be positioned at an intermediate portion of the image sensor 811 and the image signal processor 813, and may transfer the image signal received from the image sensor 811 to the image signal processor 813.

Figure 2:
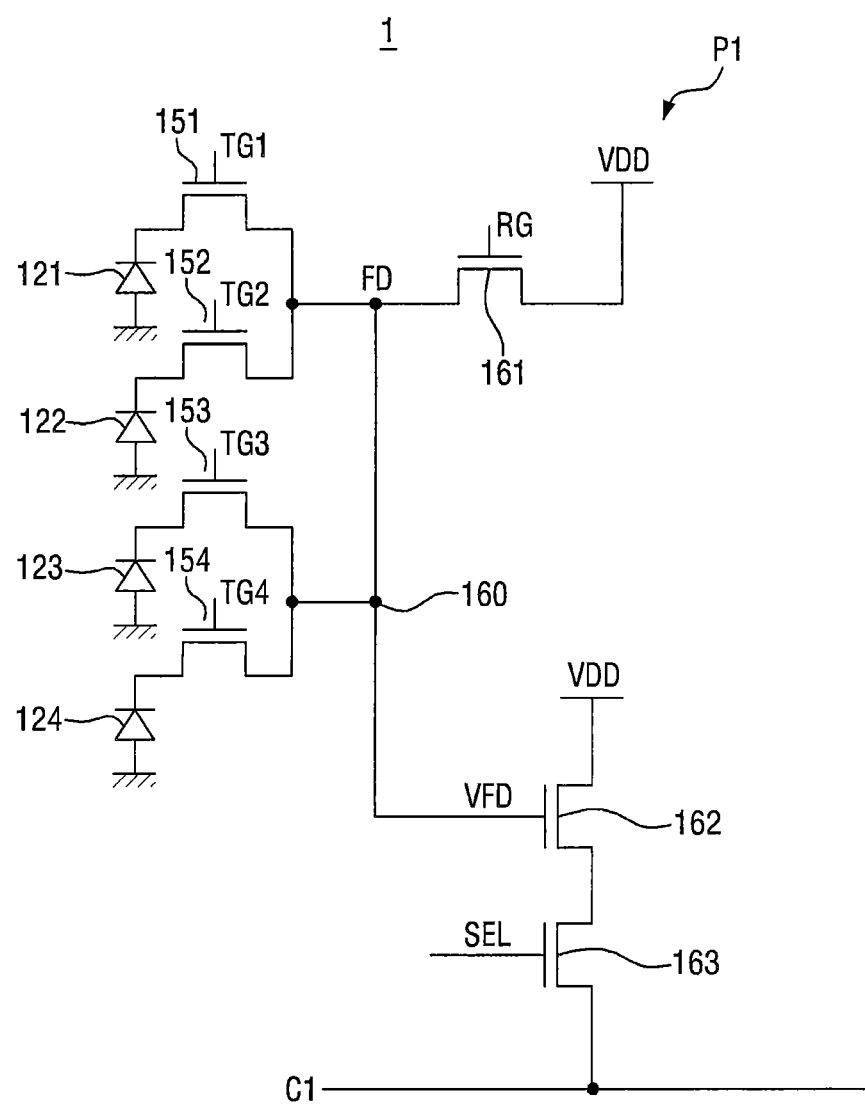
FIG. 2 illustrates circuit diagrams for unit pixels included in the pixel arrays of FIG. 1.

FIG. 2 is a diagram illustrating circuit diagrams for unit pixels included in the pixel arrays of FIG. 1.

Referring to FIG. 2, a unit pixel (for example, P1) included in the pixel array according to embodiments of the present inventive concepts may include a plurality of photo diodes 121 to 124, a plurality of transfer transistors 151 to 154, a reset transistor 161, a drive transistor 162, and a select transistor 163. Hereinafter, pixels having a 7-transistor structure are described as examples as illustrated in FIG. 2, but the present inventive concepts are not limited thereto. As described above, the structure of the pixel may be modified to a 4-transistor structure, a 5-transistor structure, a 6-transistor structure, and the like in any degree. In embodiments of the present inventive concepts, each of the plurality of photo diodes 121 to 124 and each of the plurality of transfer transistors 151 to 154 may share one set of the reset transistor 161, the drive transistor 162, and the select transistor 163 constituting a pixel circuit.

The photo diodes 121 to 124 act as light receivers that receive an external optical image and may generate a photo charge in proportion to incident light. Although the photo diodes 121 to 124 are illustrated as an example of a light-receiving element in FIG. 2, the present inventive concepts are not limited thereto and forms of the light-receiving element may be modified in any degree.

The photo diodes 121 to 124 may be connected between the transfer transistors 151 to 154 and a ground GND.

The transfer transistors 151 to 154 may serve to transfer the photo charge generated by the photo diodes 121 to 124 to a gate terminal of the drive transistor 162 through the floating diffusion node FD. To this end, in the transfer transistors 151 to 154, drain terminals may be connected to the floating diffusion node FD, source terminals may be connected to the photo diodes 121 to 124, and gate terminals may be connected to the row driver 840 of FIG. 1. When transfer control signals TG1 to TG4 are provided from the row driver 840 of FIG. 1, the transfer transistors 151 to 154 may be turned on, and outputs of the photo diodes 121 to 124 may be provided to the floating diffusion node FD.

A reset transistor 161 may apply a reset voltage to a gate terminal of the drive transistor 162. To this end, in the reset transistor 161, a drain terminal may be connected to a power supply terminal VDD, a source terminal may be connected to the floating diffusion node FD, and a gate terminal may be connected to the row driver 840 of FIG. 1. When a reset control signal RG is provided from the row driver 840 of FIG. 1, the reset transistor 161 may be turned on, and as a result, an output of the power supply terminal VDD may be provided to the gate terminal of the drive transistor 162. When the output of the power supply terminal VDD is provided to the gate terminal of the drive transistor 162 as described above, the drive transistor 162 may be fully turned on, and as a result, the output of the drive transistor 162 may be reset.

The drive transistor 162 may generate source-drain current in proportion to the intensity of the photo charge applied to the gate terminal. In detail, a floating diffusion voltage VFD proportional to the intensity of the photo charge generated from the photo diodes 121 to 124 may be generated in the floating diffusion node FD, and the floating diffusion voltage VFD may be applied to the gate terminal of the drive transistor 162, and as a result, a source-drain current proportional to the intensity of the photo charge may be generated.

For such an operation, in the drive transistor 162, the drain terminal may be connected to the power supply terminal VDD, and the source terminal may be connected to a drain terminal of the select transistor 163. The gate terminal of the drive transistor 162 may be connected to the floating diffusion node FD which is a common terminal of drain terminals of the transfer transistors 151 to 154 and a source terminal of the reset transistor 161.

The select transistor 163 may transfer current generated from the drive transistor 162 to a column line C1. To this end, in the select transistor 163, the drain terminal may be connected to the source terminal of the drive transistor 162, a source terminal may be connected to the column line C1, and a gate terminal may be connected to a row selection line SEL. By such a configuration, the select transistor 163 may be gated to the select control signal applied to the row selection line SEL in order to output the source-drain current (herein, this may be the image signal) generated by the drive transistor 162 to the column line C1. However, the present inventive concepts are not limited thereto.

Figure 3:
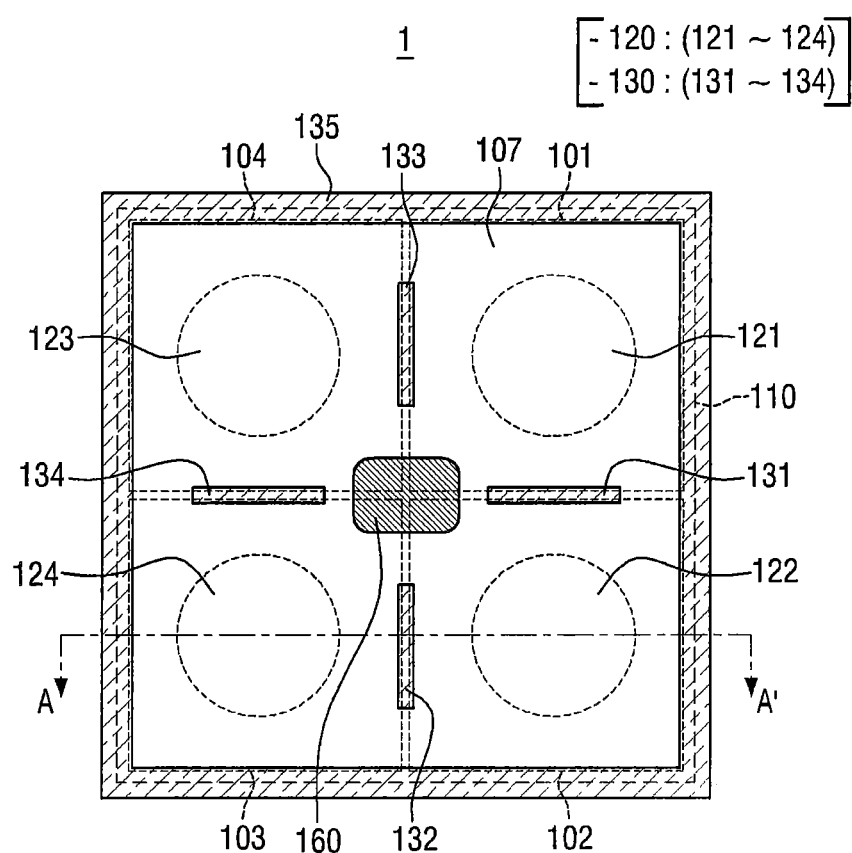
FIG. 3 illustrates a layout for the unit pixels according to embodiments of the present inventive concepts.
Figure 4:
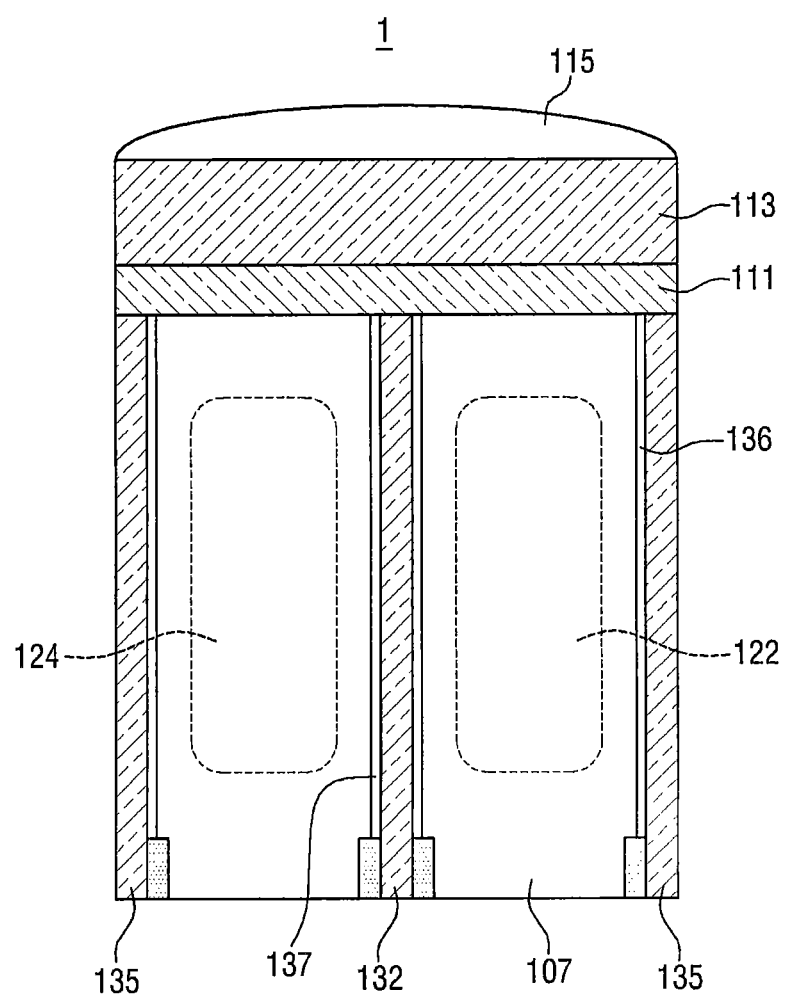
FIG. 4 is a cross-sectional view taken along line A-A' of FIG. 3.

FIG. 3 is a diagram illustrating a layout for unit pixels according to the embodiment of the present inventive concepts. FIG. 4 is a cross-sectional view taken along line A-A' of FIG. 3.

Referring to FIGS. 3 and 4, unit pixels 1 according to embodiments of the present inventive concepts may constitute the pixel array 810 of FIG. 1 in a matrix pattern. The unit pixel 1 may include a photo diode 120 (represented in FIG. 3 by photo diodes 121 to 124), a first deep trench isolation (DTI) 135, a second DTI 130 (represented in FIG. 3 by partial second DTIs 131 to 134), a shallow trench isolation (STI) 107, a color filter 113, and a floating diffusion node 160.

The unit pixel 1 according to embodiments of the present inventive concepts may include four photo diodes 121 to 124. That is, the photo diodes 120 of unit pixel 1 may include first to fourth photo diodes 121 to 124. The photo diodes 120 may be arranged in a lattice shape, however, the present inventive concepts are not limited thereto. The unit pixel 1 may be divided into first to fourth unit areas 101 to 104, and the respective unit areas may be divided by a second DTI 130. One photo diode 120 may be disposed in each of the unit areas 101 to 104. In FIGS. 3 and 4, the photo diode 120 may be represented in only a part of each of the unit areas 101 to 104, but the photo diode 120 may be formed at a part or throughout the entirety of each of the unit areas 101 to 104. For example, the first photo diode 121 may be formed in the first unit area 101, and the second photo diode 122 may be formed in the second unit area 102. However, the present inventive concepts are not limited thereto. The first to fourth photo diodes 121 to 124 may share the same-color color filter 113. A detailed description thereof will be made below.

The first DTI 135 may fully surround lateral surfaces of the unit pixel 1. The first DTI 135 may be formed on the periphery of the unit pixel 1 and may be dug vertically deep for electrical separation with other adjacent pixels. Oxide, polysilicon, and the like, for example, may be filled in the first DTI 135 formed by a first DTI process. The first DTI 135 may prevent an electrical crosstalk phenomenon that deteriorates a signal-to-noise ratio due to the exchange of a carrier with other adjacent pixels. Further, a side wall 136 of the first DTI 135 may be doped with a material having a high reflectance of light in order to prevent an optical crosstalk phenomenon in which light that is incident in the unit pixel 1 penetrates other adjacent pixels to deteriorate the signal-to-noise ratio. For example, the side wall 136 of the first DTI 135 may be formed by a polysilicon layer doped with boron having high reflectance, but is not limited thereto.

The STI 107 may be formed inside the first DTI 135. The STI 107 may be formed by an STI process for electric separation of each pixel circuit and may have a smaller depth than the first DTI 135.

The second DTI 130 may be positioned among the plurality of photo diodes 121 to 124 and may be spaced apart from the first DTI 135. The second DTI 130 may include first to fourth partial DTIs 131 to 134. For example, a first pixel 110 including the first to fourth photo diodes 121 to 124 may include the first partial DTI 131 disposed between the first and second photo diodes 121 and 122 in a first direction, the second partial DTI 134 positioned between the third and fourth photo diodes 123 and 124 and disposed in the first direction, the third partial DTI 133 positioned between the first and third photo diodes 121 and 123 and disposed in a second direction crossing the first direction, and the fourth partial DTI 132 positioned between the second and fourth photo diodes 122 and 124 and disposed in the second direction. The first direction and the second direction may be perpendicular to each other. Further, the first to fourth partial DTIs 131 to 134 may be disposed to be spaced apart from the floating diffusion node 160 and the first DTI 135. However, the present inventive concepts are not limited thereto and the first to fourth partial DTIs 131 to 134 may contact the floating diffusion node 160, or the first DTI 135 and the first to fourth partial DTIs 131 to 134 may be formed to contact each other.

The second DTI 130 may be formed by the same process as the first DTI 135. In detail, the second DTI 130 may be dug vertically deep for electric separation among the plurality of photo diodes 121 to 124 in the unit pixel 1. The oxide, the polysilicon, and the like, for example, may be filled in the second DTI 130. The second DTI 130 may prevent an electrical crosstalk phenomenon that deteriorates the signal-to-noise ratio due to the exchange of a carrier with other adjacent photo diodes. Further, a side wall 137 of the second DTI 130 may be doped with a material having a high reflectance of light in order to prevent an optical crosstalk phenomenon in which light that is incident in the unit pixel 1 penetrates the other adjacent photo diodes to deteriorate the signal-to-noise ratio. For example, the side wall 137 of the second DTI 130 may be formed by a polysilicon layer doped with the boron having high reflectance, but is not limited thereto.

The floating diffusion node 160 may be positioned at the center of the unit pixel 1. The floating diffusion node 160 may be electrically connected with all of the first to fourth photo diodes 121 to 124. That is, the plurality of photo diodes 121 to 124 may share one floating diffusion node 160. Further, the floating diffusion node 160 may be disposed in an area in which the second DTI 130 is not formed. In other words, the second DTI 130 may be disposed partially among the plurality of photo diodes 121 to 124 so that the plurality of photo diodes 121 to 124 can share the floating diffusion node 160 in the unit areas 101 to 104.

The plurality of photo diodes 121 to 124 may share the floating diffusion node 160, and as a result, a useful dimension of the unit pixels 1 according to embodiments of the present inventive concepts may be increased. In detail, when the plurality of photo diodes 121 to 124 are included in one pixel, the DTI may be formed in a full surround manner in order to reduce crosstalk among the plurality of photo diodes 121 to 124. However, when the DTI is formed in the full surround manner for each photo diode 120, a contact connected to the floating diffusion node 160 may be created for each photo diode 120. In contrast, when the second DTI 130 is disposed partially among the plurality of photo diodes 121 to 124 as described in some embodiments of the present inventive concepts, the floating diffusion node 160 may be disposed in space of the unit pixel 1 in which the second DTI 130 is not disposed, and as a result, the plurality of photo diodes 121 to 124 may share the floating diffusion node 160 without using a separate contact. Therefore, the useful dimension of the unit pixels 1 may be increased.

The floating diffusion node 160 may be formed to be adjacent to a gate of the transfer transistor. The floating diffusion node 160 may be a node in which photo charges generated by the photo diode 120 are transmitted and accumulated through the transfer transistor TG. A detailed description of the floating diffusion node 160 will be made below.

Referring to FIG. 4, FIG. 4 illustrates a vertical cross-section vertically taken along line A-A' of FIG. 3. The unit pixel 1 may be formed by stacking a micro lens 115, a color filter 113, an anti-reflection layer 111, and a semiconductor substrate. In FIG. 4, a direction in which light reflected from a target is incident will be defined and described as an uppermost portion.

A micro lens 115 may be used to increase image quality by increasing light gathering power.

A color filter 113 may be formed below the micro lens 115, and may selectively transmit light having a specific wavelength (for example, red, green, blue, magenta, yellow, or cyan). In some embodiments, a flat layer called an over-coating layer may be formed below the color filter 113. In some embodiments, the color filter 113 may be omitted when the unit pixels 1 constitute a depth sensor. Further, the color filter 113 may be positioned on the first to fourth photo diodes 121 to 124 and fully overlap the first to fourth photo diodes 121 to 124. That is, one unit pixel 1 may include only the color filter 113 that selectively transmits only light having a specific wavelength.

An anti-reflection layer 111 may be formed below the color filter 113 and may prevent incident light that is incident through the micro lens 115 and the color filter 113 from being reflected. That is, the anti-reflection layer 111 may efficiently transmit the incident light in order to improve the performance (for example, light-receiving efficiency and light sensitivity) of the image sensor.

The first DTI 135 may prevent an electrical crosstalk and an optical crosstalk phenomenon among the plurality of unit pixels 1 adjacent in the pixel array 810 of FIG. 1 as described in FIG. 3. The side wall 136 of the first DTI 135 may be doped with the material having a high reflectance of light.

Similarly, the second DTI 130 may prevent the electrical crosstalk phenomenon and the optical crosstalk phenomenon among the plurality of adjacent photo diodes 121 to 124. The side wall 137 of the second DTI 130 may be doped with the material having a high reflectance of light.

The photo diode 120 may be subjected to an ion implantation process to be formed as an n-type area. The photo diode 120 as a photoelectric conversion element may generate a photo charge which is varied according to the intensity of the incident light. In some embodiments, the photo diode 120 may be implemented not by the photo diode 120 but by a photo transistor, a pinned photo diode, or a combination thereof, for example. In some embodiments, the photo diode may be formed by stacking a plurality of doping areas. In this case, a lower doping area may be formed by implanting n+ type ions and an upper doping area may be formed by implanting n− type ions. The photo diode 120 may be formed throughout the entire dimension other than the DTIs 130 and 135 in the respective unit areas 101 to 104, in order to acquire a high fill-factor. The fill-factor may be defined by a dimension of the unit pixel 1 and a ratio of a light-receiving area, and as a value thereof is higher, the light-receiving efficiency may be improved.

The STI 107 may be formed for electric separation among adjacent elements as described in FIG. 3. The STI 107 may be formed with a smaller depth than the DTIs 130 and 135, and may be formed to contact the DTIs 130 and 135. However, the present inventive concepts are not limited thereto.

Although not illustrated in FIGS. 3 and 4, a well layer may be present below the photo diode 120. A detailed description thereof will be made below.

Figure 5:
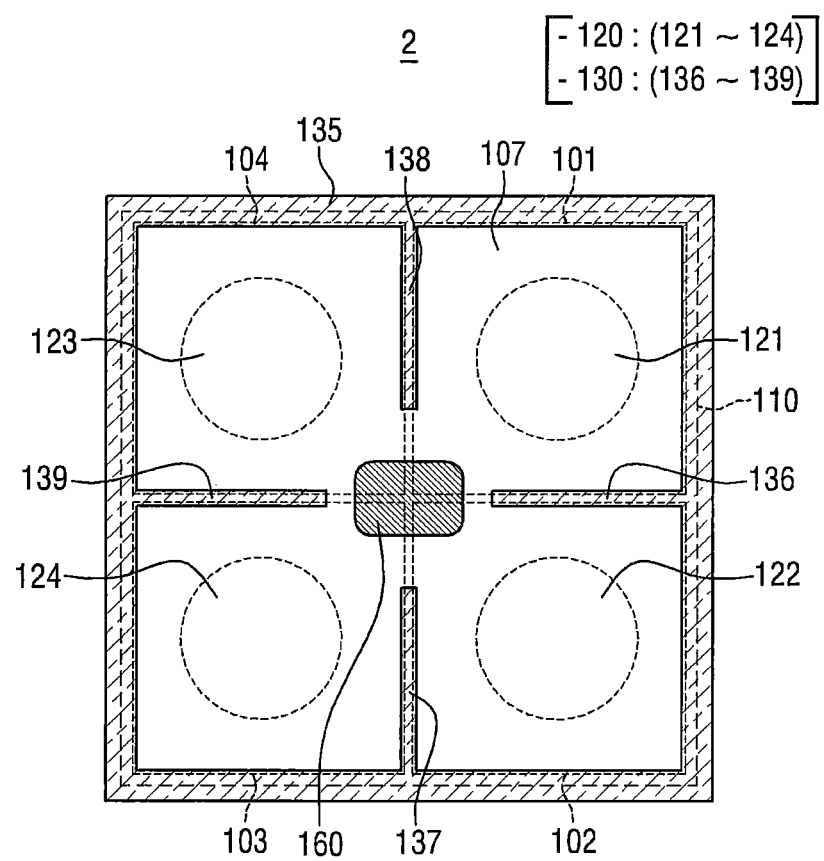
FIG. 5 is a diagram illustrating a layout for unit pixels according to other embodiments of the present inventive concepts.

FIG. 5 is a diagram illustrating a layout for unit pixels according to other embodiments of the present inventive concepts. For easy description, hereinafter, a duplicated description of the same matter as the aforementioned embodiment will be omitted and a difference from the aforementioned embodiments will be primarily described.

Referring to FIG. 5, unit pixels 2 according to other embodiments of the present inventive concepts may be formed substantially similarly as the unit pixels 1 described with reference to FIG. 3.

The unit pixel 2 may include the photo diode 120 (represented by photo diodes 121 to 124 in FIG. 5), the first DTI 135, the second DTI 130 (represented by partial DTIs 136 to 139 in FIG. 5), the STI 107, and the floating diffusion node 160.

The second DTI 130 may be positioned among the plurality of photo diodes 121 to 124 and may be formed to contact the first DTI 135. Further, the second DTI 130 may be formed integrally with the first DTI 135. Oxide, the polysilicon, and the like, for example, may be formed by the same process and may be filled in the first DTI 135 and the second DTI 130. The first DTI 135 and the second DTI 130 may prevent an electrical crosstalk phenomenon and an optical crosstalk phenomenon among other unit pixels 2 and the plurality of photo diodes 121 to 124 which are adjacent to each other.

The second DTI 130 may include first to fourth partial DTIs 136 to 139. For example, the first pixel 110 including the first to fourth photo diodes 121 to 124 may include the first partial DTI 136 disposed between the first and second photo diodes 121 and 122 in a first direction, the second partial DTI 139 positioned between the third and fourth photo diodes 123 and 134 and disposed in the first direction, the third partial DTI 138 positioned between the first and third photo diodes 121 and 123 and disposed in a second direction crossing the first direction, and the fourth partial DTI 137 positioned between the second and fourth photo diodes 122 and 124 and disposed in the second direction.

The first to fourth DTIs 136 to 139 may be formed to be spaced apart from each other. As a result, the second DTI 130 may not be formed at the center of the unit pixel 2 and the floating diffusion node 160 may be formed in empty space. The first to fourth partial DTIs 136 to 139 may be disposed to be spaced apart from the floating diffusion node 160. However, the present inventive concepts are not limited thereto and the first to fourth partial DTIs 136 to 139 may be formed to contact the floating diffusion node 160.

Figure 6:
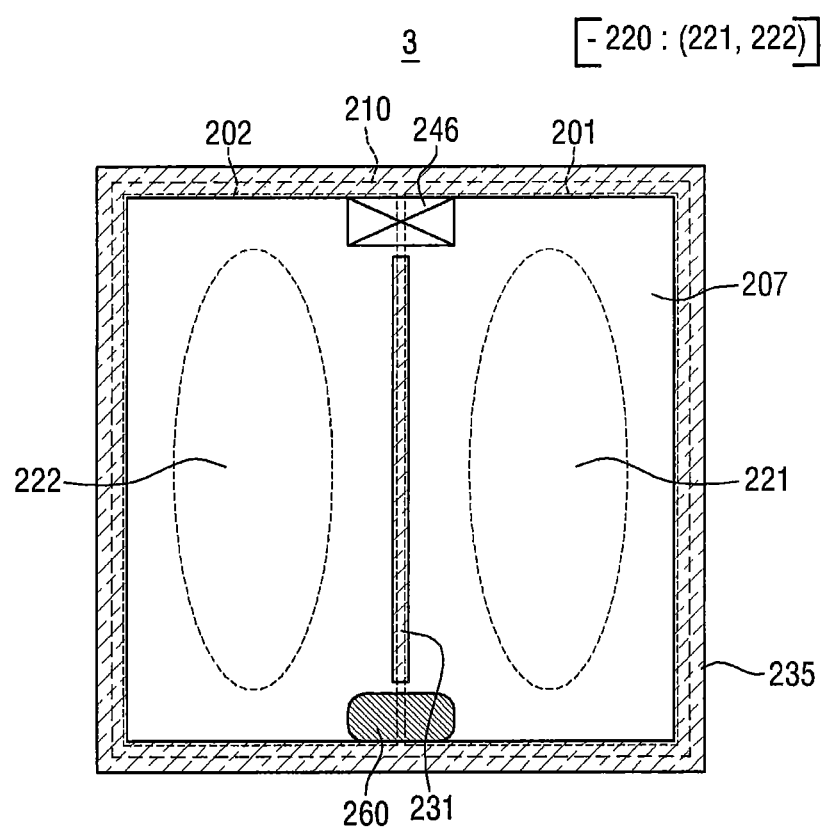
FIG. 6 is a diagram illustrating a layout for unit pixels according to yet other embodiments of the present inventive concepts.

FIG. 6 is a diagram illustrating a layout for unit pixels according to other embodiments of the present inventive concepts. For easy description, hereinafter, a duplicated description of the same matter as the aforementioned embodiments will be omitted and a difference from the aforementioned embodiment will be primarily described.

Referring to FIG. 6, the unit pixel 3 according to other embodiments of the present inventive concepts may have a structure in which two photo diodes 220 (represented by photo diodes 221 and 222 in FIG. 6) are included in the unit pixel 3. The unit pixel 3 may include a photo diode 220, a first DTI 235, a second DTI 231, an STI 207, a floating diffusion node 260, and a ground 246.

The unit pixel 3 may include a first photo diode 221 and a second photo diode 222 that are adjacent to each other. The photo diode 220 may be represented in only a portion of each of the unit areas 201 and 202 in FIG. 6, but the photo diode 220 may be formed in a portion or throughout the entirety of each of the unit areas 201 and 202. For example, the first photo diode 221 may be formed in the first unit area 201 and the second photo diode 222 may be formed in the second unit area 202. However, the present inventive concepts are not limited thereto.

The first DTI 235 may fully surround sides of the first and second photo diodes 221 and 222, and may electrically separate other pixels adjacent to the unit pixel 3 from the first pixel 210.

The second DTI 231 may be positioned between the first photo diode 221 and the second photo diode 222. Both sides of the second DTI 231 may be formed to be spaced apart from the first DTI 235. However, the present inventive concepts are not limited thereto.

Although not illustrated in FIG. 6, the first photo diode 221 and the second photo diode 222 may be fully overlapped by a single color filter that transmits only light having a specific wavelength.

A floating diffusion node 260 may be electrically connected with the first photo diode 221 and the second photo diode 222. That is, the first and second photo diodes 221 and 222 may share a floating diffusion node 260. The floating diffusion node 260 may be disposed between one side of the second DTI 231 and the first DTI 235.

The ground 246 may be positioned opposite the floating diffusion node 260 between the second DTI 231 and the first DTI 235. The ground 246 and the floating diffusion node 260 may be formed to face each other. The ground 246 may be electrically connected with the first photo diode 221 and the second photo diode 222. That is, the first and second photo diodes 221 and 222 may share the ground 246. However, the present inventive concepts are not limited thereto.

Figure 7:
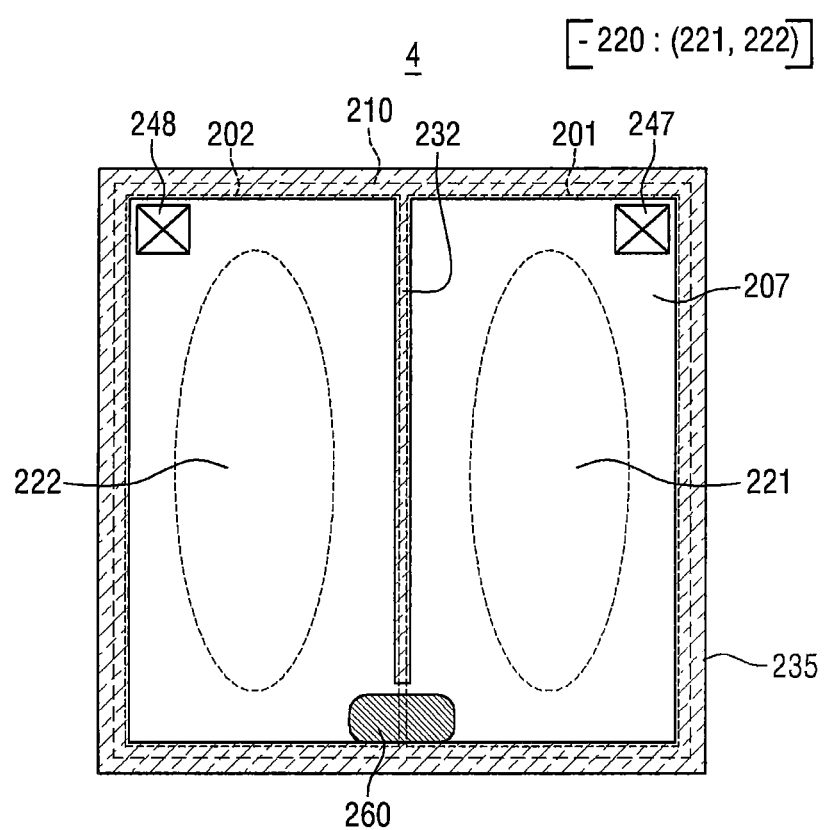
FIG. 7 is a diagram illustrating a layout for unit pixels according to still other embodiments of the present inventive concepts.

FIG. 7 is a diagram illustrating a layout for unit pixels according to still other embodiments of the present inventive concepts. For easy description, hereinafter, a duplicated description of the same matter as the aforementioned embodiments will be omitted and a difference from the aforementioned embodiment will be primarily described.

Referring to FIG. 7, the unit pixel 4 according to still other embodiments of the present inventive concepts may be formed substantially similarly as the pixel 3 described with reference to FIG. 6. The unit pixel 4 may include the photo diode 220 (represented by photo diodes 221 and 222 in FIG. 7), the first DTI 235, the second DTI 232, the STI 207, and the floating diffusion node 260, and the grounds 247 and 248.

The second DTI 232 may be positioned between the first photo diode 221 and the second photo diode 222, and one side of the second DTI 232 may be formed to contact the first DTI 235. However, the other side of the second DTI 232 may be formed to be spaced apart from the first DTI 235. The second DTI 232 may be formed integrally with the first DTI 235. However, the present inventive concepts are not limited thereto. The oxide, the polysilicon, and the like, for example, may be formed by the same process and may be filled in the first DTI 235 and the second DTI 232. The first DTI 235 and the second DTI 232 may prevent an electrical crosstalk phenomenon and an optical crosstalk phenomenon among other unit pixels and the plurality of photo diodes 220 which are adjacent to each other.

The floating diffusion node 260 may be electrically connected with the first photo diode 221 and the second photo diode 222. That is, the first and second photo diodes 221 and 222 may share one floating diffusion node 260. The floating diffusion node 260 may be disposed in a space between the second DTI 232 and the first DTI 235.

The grounds 247 and 248 may include a first ground 247 and a second ground 248. The first ground 247 may be connected with the first photo diode 221 and the second ground 248 may be connected with the second photo diode 222. The first ground 247 and the second ground 248 may be disposed to be spaced apart from each other. The first ground 247 and the second ground 248 may be disposed to be symmetric to each other based on the second DTI 232. However, the present inventive concepts are not limited thereto.

Figure 8:
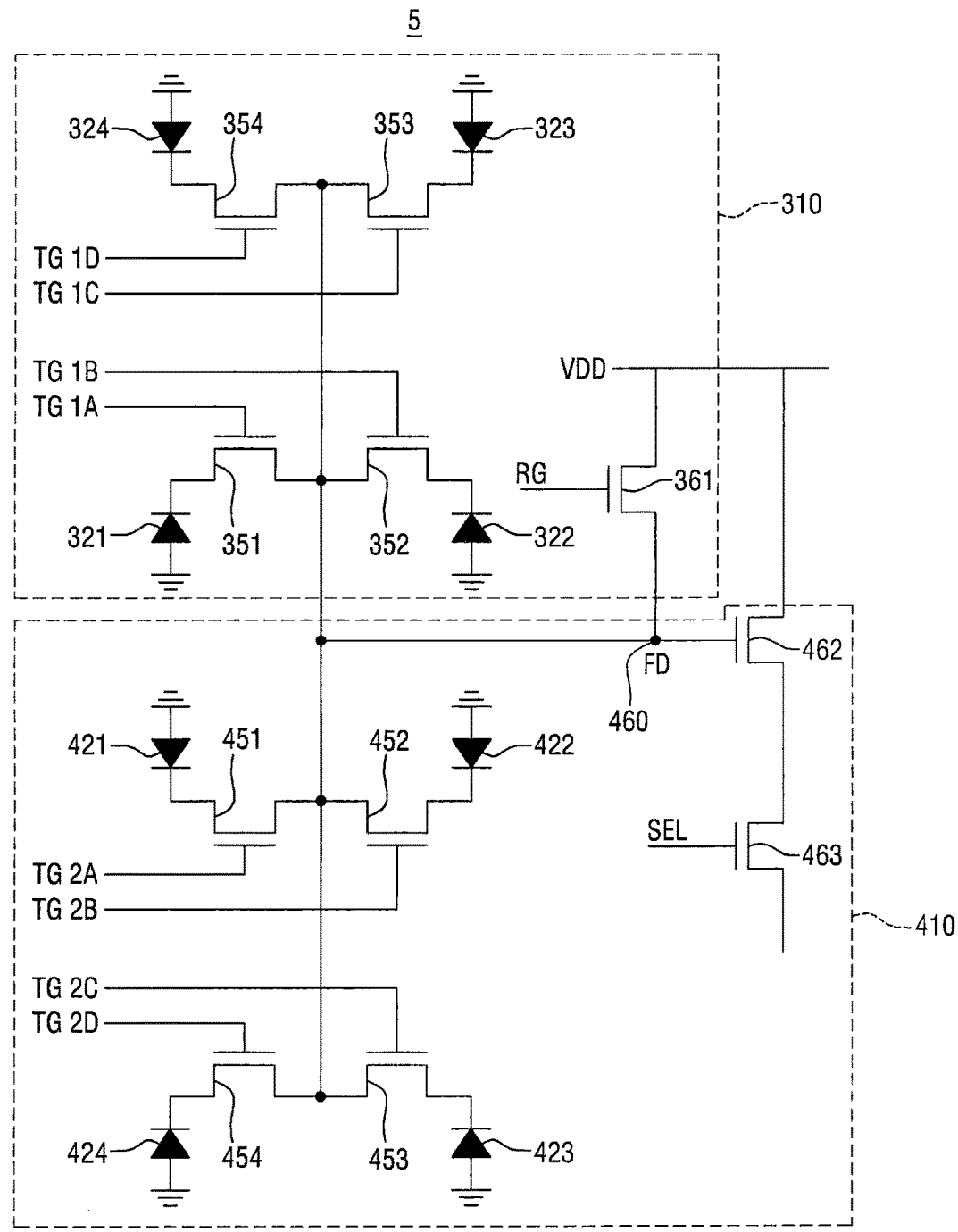
FIG. 8 is a diagram illustrating a circuit diagram for pixel arrays according to embodiments of the present inventive concepts.
Figure 9:
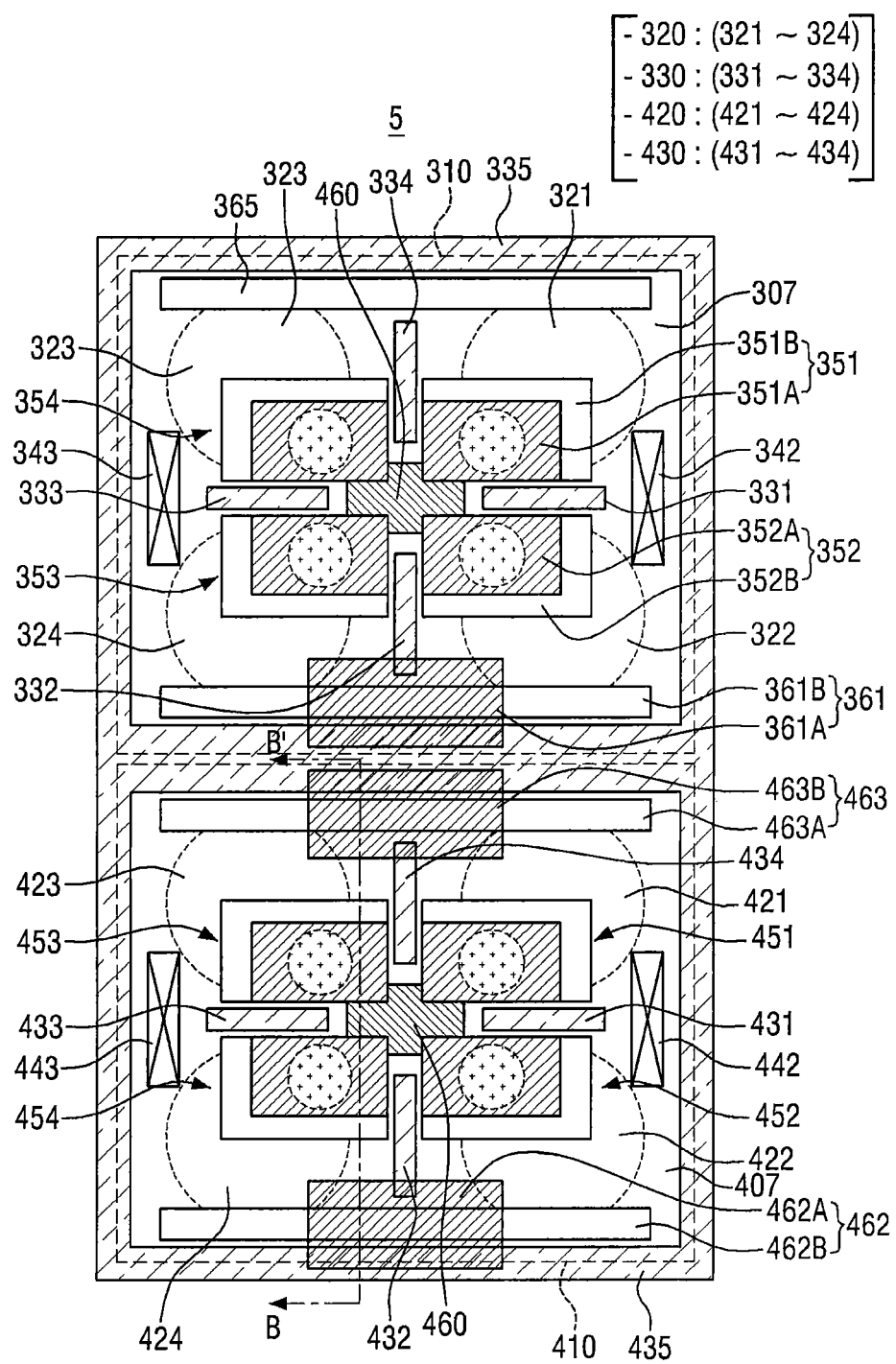
FIG. 9 is a diagram illustrating a layout for pixel arrays according to embodiments of the present inventive concepts.
Figure 10:
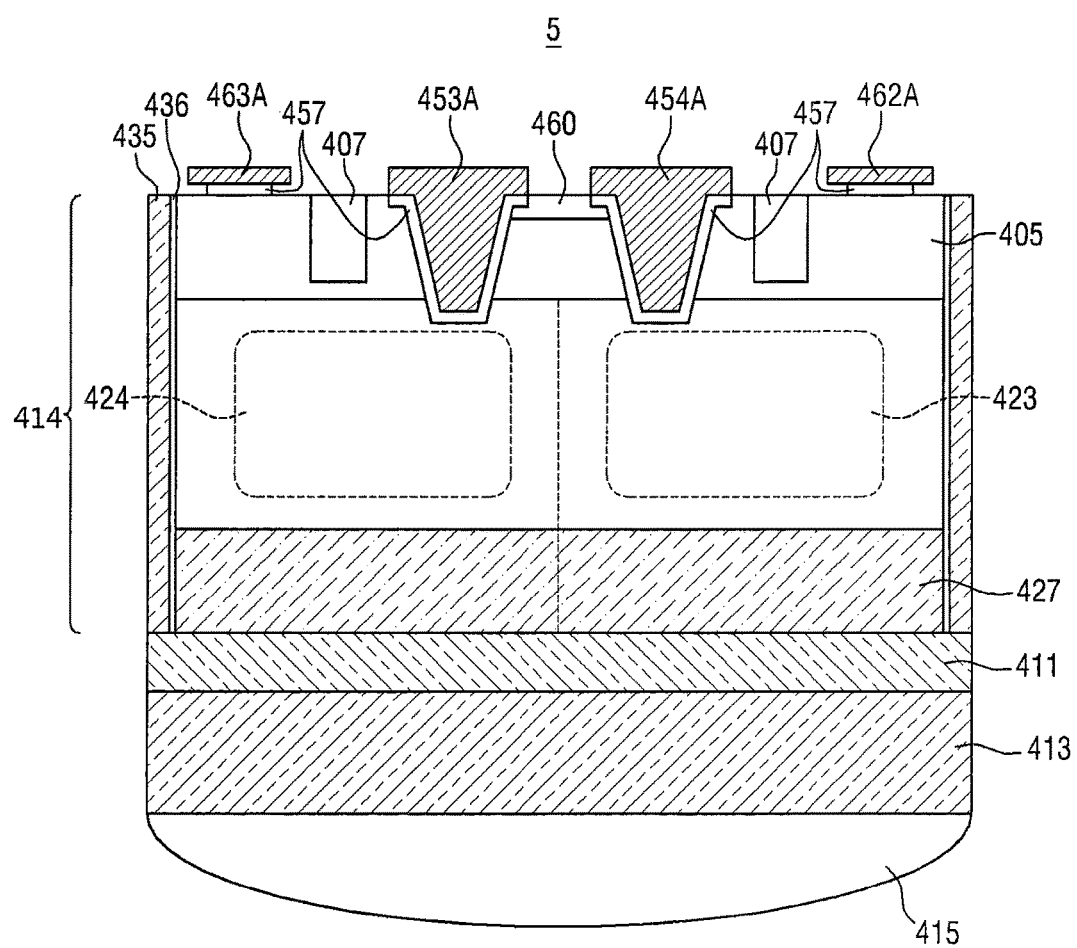
FIG. 10 is a cross-sectional view taken along line B-B' of FIG. 9.

FIG. 8 is a diagram illustrating a circuit diagram for pixel arrays according to embodiments of the present inventive concepts. FIG. 9 is a diagram illustrating a layout for pixel arrays according to embodiments of the present inventive concepts. FIG. 10 is a cross-sectional view taken along line B-B' of FIG. 9.

Referring to FIGS. 8 to 10, pixel arrays 5 according to embodiments of the present inventive concepts may include a first pixel 310 and a second pixel 410. The second pixel 410 may be disposed to be adjacent to the first pixel 310, and the first pixel 310 and the second pixel 410 may be arranged in the matrix pattern.

The first pixel 310 may include a first photo diode 320 (represented by photo diodes 321 to 324 in FIG. 9), a first DTI 335, a second DTI 330 (represented by partial DTIs 331 to 334 in FIG. 9), a first color filter, a first floating diffusion node 460, and first supplement transistors 361 and 365. Similarly, the second pixel 410 may include a second photo diode 420 (represented by photo diodes 421 to 424 in FIG. 9), a third DTI 435, a fourth DTI 430 (represented by partial DTIs 431 to 434 in FIG. 9), a second color filter 413, a second floating diffusion node 460, and second supplement transistors 462 and 463. Structures of the first pixel 310 and the second pixel 410 may be substantially the same as that of the unit pixels 1 described with reference to FIG. 3.

Referring to FIG. 8, the first photo diode 320 may include four photo diodes 321 to 324. The first photo diode 320 may be arranged in a lattice shape. However, the present inventive concepts are not limited thereto. The first photo diode 320 may be connected between transfer transistors 351 to 354 and grounds 342 and 343.

The transfer transistors 351 to 354 may transfer a photo charge generated by the first photo diode 320 to a gate terminal of a drive transistor 462 through the floating diffusion node 460. To this end, in the transfer transistors 351 to 354, drain terminals may be connected to the floating diffusion node 460, source terminals may be connected to the photo diode 320, and gate terminals may be connected to the row driver 840 of FIG. 1. When transfer control signals TG1A to TG1D are provided from the row driver 840 of FIG. 1, the transfer transistors 351 to 354 may be turned on, and an output of the photo diode 320 may be provided to the floating diffusion node 460.

Similarly, the second photo diode 420 may include four photo diodes 421 to 424. The second photo diodes 421 to 424 may be connected between transfer transistors 451 to 454 and grounds 442 and 443.

The transfer transistors 451 to 454 may transfer a photo charge generated by the photo diodes 421 to 424 to a gate terminal of a drive transistor 462 through the floating diffusion node 460.

The reset transistor 361 may apply a reset voltage to the gate terminal of the drive transistor 462. When a reset control signal RG is provided from the row driver 840 of FIG. 1, the reset transistor 461 may be turned on, and as a result, the output of the power supply terminal VDD may be provided to the gate terminal of the drive transistor 462. The reset transistor 361 may be included in the first pixel 310. However, the present inventive concepts are not limited thereto.

The drive transistor 462 may generate source-drain current in proportion to the intensity of the photo charge applied to the gate terminal. In detail, the floating diffusion voltage VFD proportional to the intensity of the photo charge generated from the first photo diode 320 or the second photo diode 420 may be generated in the floating diffusion node 460. The floating diffusion voltage VFD may be applied to the gate terminal of the drive transistor 462, and as a result, the source-drain current proportional to the intensity of the photo charge may be generated.

The select transistor 463 may transfer the current generated from the drive transistor 462 to a column line. The select transistor 463 may be gated to the select control signal applied to the row selection line SEL in order to output to the column line the source-drain current (herein, this may be the image signal) generated by the drive transistor 462. The drive transistor 462 and the select transistor 463 may be included in the second pixel 410. However, the present inventive concepts are not limited thereto.

Referring to FIG. 9, the first pixel 310 may include four photo diodes 321 to 324. The photo diodes 321 to 324 may be arranged in a lattice shape. However, the present inventive concepts are not limited thereto.

The first DTI 335 may fully surround a side of the first pixel 310, and may electrically separate the first pixel 310 and the second pixel 410. The first DTI 335 may be formed on the periphery of the first pixel 310, and may be dug vertically deep for electrical separation with other adjacent pixels.

The second DTI 330 may be disposed among the photo diodes 321 to 324, and one side may be formed to be spaced apart from the first DTI 335. The second DTI 330 may include first to fourth partial DTIs 331 to 334. For example, the first pixel 310 including the first to fourth photo diodes 321 to 324 may include the first partial DTI 331 disposed between the first and second photo diodes 321 and 322 in a first direction, the second partial DTI 333 positioned between the third and fourth photo diodes 323 and 324 and disposed in the first direction, the third partial DTI 334 positioned between the first and third photo diodes 321 and 323 and disposed in a second direction crossing the first direction, and the fourth partial DTI 332 positioned between the second and fourth photo diodes 322 and 324 and disposed in the second direction. The first direction and the second direction may be perpendicular to each other. Further, the first to fourth partial DTIs 331 to 334 may be disposed to be spaced apart from the floating diffusion node 460 and the first DTI 335. However, the present inventive concepts are not limited thereto, and the first to fourth partial DTIs 331 to 334 may contact the floating diffusion node 460 or the first DTI 335.

Although not illustrated in FIG. 9, a first color filter may be positioned on the photo diodes 321 to 324 and may fully overlap the photo diodes 321 to 324.

The first floating diffusion node 460 may be electrically connected with the photo diode 320. The first floating diffusion node 460 may be disposed at the center of the first pixel 310. The transfer transistors 351 to 354 may connect the first floating diffusion node 460 and the photo diode 320. In detail, the transfer transistors 351 to 354 of the first pixel 310 may be disposed on the photo diode 320. The transfer transistors 351 to 354 may be constituted by gates 351A to 354A and active areas 351B to 354B. The first floating diffusion node 460 may be formed to be adjacent to the gates 351A to 354A of the transfer transistors 351 to 354. The floating diffusion node 460 may transmit the photo charges generated by the photo diodes 321 to 324 through the transfer transistors 351 to 354.

The first supplement transistors 361 and 365 may be electrically connected with the first floating diffusion node 460. The first supplement transistors 361 and 365 may be formed to be separated by the transfer transistors 351 to 354 and the STI 307. The first supplement transistors 361 and 365 may be, for example, any one of a dummy transistor, a reset transistor, a drive transistor, and a select transistor. For example, the first supplement transistors 361 and 365 may be the reset transistors 361.

The grounds 342 and 343 may supply ground voltage required for an operation of the unit pixels 5. For example, the grounds 342 and 343 may supply the ground voltage to one side end of the photo diode 320. The grounds 342 and 343 may be disposed between the first DTI 335 and the second DTI 330. For example, the first ground 342 may be connected to the first photo diode 321 and the second photo diode 322, and the second ground 343 may be connected to the third photo diode 323 and the fourth photo diode 324.

P-WELL areas 351B to 354B and 361B may be formed around gates 361A of the first supplement transistors 361 and 365 and the gates 351A to 354A of the transfer transistors 351 to 354. An area doped with n++ may be formed in the P-WELL areas 351B to 354B and 361B, and may serve as source terminals or drain terminals of the first supplement transistors 361 and 365. That is, the P-WELL areas 351B to 354B and 361B may electrically insulate the area doped with n++.

The second pixel 410 may have substantially the same structure as the first pixel 310 described above. The second pixel 410 may include four photo diodes 421 to 424. The photo diodes 421 to 424 may be arranged in a lattice shape, however, the present inventive concepts are not limited thereto.

A third DTI 435 may fully surround the side of the second pixel 410 and may electrically separate the second pixel 410 and the first pixel 310.

A fourth DTI 430 may be disposed among the photo diodes 421 to 424, and one side of the fourth DTI 430 may be formed to be spaced apart from the third DTI 435.

A second color filter 413 may be positioned on the photo diodes 421 to 424, and may fully overlap the photo diodes 421 to 424. The second color filter 413 illustrated in FIG. 10 may have a different color than the first color filter.

The second floating diffusion node 460 may be disposed at the center of the second pixel 410.

The transfer transistors 451 to 454 may connect the second floating diffusion node 460 and the photo diodes 421 to 424.

The second supplement transistors 462 and 463 may be electrically connected with the second floating diffusion node 460. The second supplement transistors 462 and 463 may include the drive transistor and/or the reset transistor.

For example, the drive transistor 462 may output a voltage signal corresponding to potential of the second floating diffusion node 460 to a source terminal. The drive transistor 462 may be disposed between the third DTI 435 and the fourth DTI 430. However, the present inventive concepts are not limited thereto.

The select transistor 463 may output the voltage signal to a column line according to the selection control signal. The select transistor 463 may be disposed between the third DTI 435 and the fourth DTI 430. In detail, the select transistor 463 may be disposed between the second partial DTI 432 and the third DTI 435, and the drive transistor 462 may be disposed between the fourth partial DTI 434 and the third DTI 435. However, the present inventive concepts are not limited thereto.

The grounds 442 and 443 may be disposed between the third DTI 435 and the fourth DTI 430. In detail, the first ground 442 may be disposed between the first partial DTI 431 and the third DTI 435, and the second ground 443 may be disposed between the third partial DTI 433 and the third DTI 435. However, the present inventive concepts are not limited thereto.

Referring to FIG. 10, FIG. 10 illustrates a vertical cross-section vertically taken along line B-B' of FIG. 9. The pixel array 5 may be formed by stacking a micro lens 415, a color filter 413, an anti-reflection layer 411, and a semiconductor substrate 414. The semiconductor substrate 414 may include the DTI 435, an epitaxial layer 427, photo diodes 423 and 424, a well layer 405, an STI 407, gates 462A and 463A of the supplement transistors 462 and 463, gates 453A and 454A of the transfer transistors 453 and 453, and the floating diffusion node 460. In FIG. 10, the description will be made, assuming that a direction in which light reflected from a target is incident is defined as a lowermost portion, and assuming that transistors included in the unit pixel are NMOS transistors.

The micro lens 415 may be formed at a position corresponding to the unit pixel below the unit pixel, and the micro lens 415 may be used to increase the image quality by increasing the light gathering power.

The color filter 413 may be formed above the micro lens 415 and may selectively transmit light having a specific wavelength (for example, red, green, blue, magenta, yellow, or cyan). In some embodiments, a flat layer called the over-coating layer may be formed below the color filter 413. In some embodiments, the color filter 413 may be omitted when the unit pixels constitute a depth sensor.

The anti-reflection layer 411 may be formed above the color filter 413 and may prevent incident light that is incident through the micro lens 415 and the color filter 413 from being reflected. That is, the anti-reflection layer 411 may efficiently transmit the incident light in order to improve the performance (for example, light-receiving efficiency and light sensitivity) of the image sensor.

The DTI 435 may prevent an electrical crosstalk and an optical crosstalk phenomenon in the relationship with adjacent pixels as described in FIG. 3. A side wall 436 of the DTI 435 may be doped with the material having a high reflectance of light.

The epitaxial layer 427 may be a p-type epitaxial layer formed on a p-type bulk silicon substrate.

Photo diodes 423 and 424 may be subjected to an ion implantation process to be formed as an n-type area in the epitaxial layer 427. The photo diodes 423 and 424 as the photoelectric conversion elements may generate a photo charge which is varied according to the intensity of the incident light, and in some embodiments, the photo diodes 423 and 424 may be implemented not by the photo diodes 423 and 424 but by the photo transistor, the pinned photo diode, or the combination thereof.

The well layer 405 may be formed above the photo diodes 423 and 424, and may electrically insulate upper transistors and the photo diodes 423 and 424. Further, an area that is adjacent to the gates 462A and 463A of the supplement transistors 462 and 463 and may be doped with n++ may serve as source and drain terminals of the supplement transistors 462 and 463. Multi-layered conductive lines may be included in an upper portion of the semiconductor substrate 414, and the multi-layered conductive lines may be formed by patterning conductive materials including metallic materials such as copper and aluminum, for example.

The STI 407 may be formed for electric separation among the adjacent elements.

The gates 462A and 463A of the supplement transistors 462 and 463 and the gates 453A and 454A of the transfer transistors 453 and 454 may be formed in upper portions of a gate insulating layer 457, respectively. The gate insulating layer 457 may be made, for example, of SiO2, SiON, SiN, Al2O3, Si3N4, GexOyNz, GexSiyOz, or a high dielectric material. The high dielectric material may be formed, for example, by HfO2, ZrO2, Al2O3, Ta2O5, hafnium silicate, zirconium silicate, or combinations thereof through an atomic layer deposition method. In particular, the gates 453A and 454A of the transfer transistors 453 and 454 may be formed by an etching process in order to correspond to the photo diodes 423 and 424 formed in the middle of the semiconductor substrate 414. In some embodiments, the gates 453A and 454A of the transfer transistors 453 and 454 may have an upper boundary depth of the photo diodes 423 and 424 or more or less.

The floating diffusion node 460 may be formed to be adjacent to the gates 453A and 454A of the transfer transistors 453 and 454. The epitaxial layer 427 may be formed between the floating diffusion node 460 and the photo diodes 423 and 424, which may be electrically insulated from each other.

Figure 11:
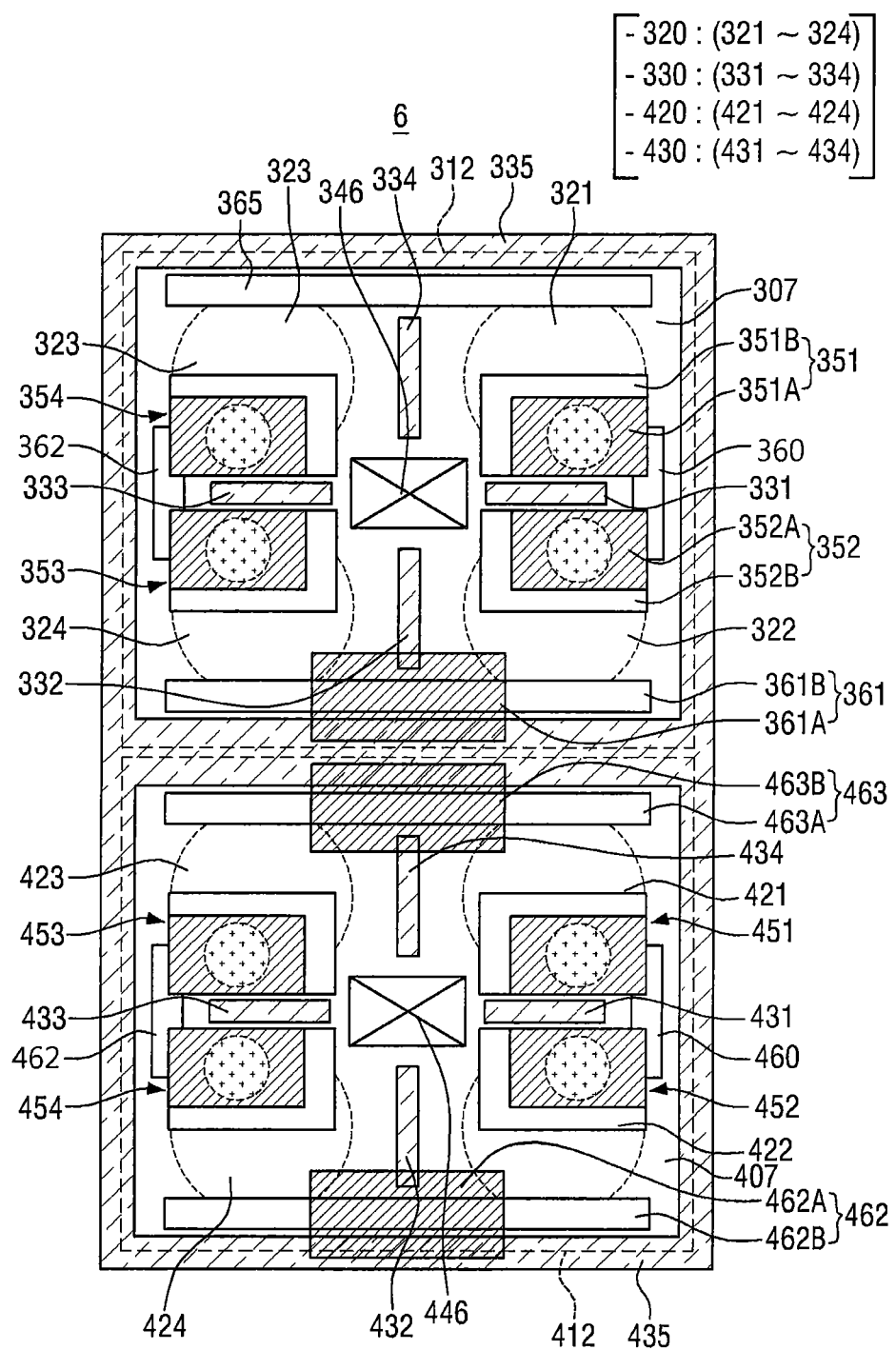
FIG. 11 is a diagram illustrating a layout for pixel arrays according to other embodiments of the present inventive concepts.

FIG. 11 is a diagram illustrating a layout for pixel arrays according to other embodiments of the present inventive concepts. For easy description, hereinafter, a duplicated description of the same matter as the aforementioned embodiment will be omitted and a difference from the aforementioned embodiment will be primarily described.

Referring to FIG. 11, pixel arrays 6 according to other embodiments of the present inventive concepts may be substantially similar as the pixel arrays 5 described with reference to FIGS. 8 to 10.

The pixel array 6 may include a third pixel 312 and a fourth pixel 412.

The third pixel 312 may further include a ground 346 positioned at the center of the third pixel 312, and a third floating diffusion node 362 electrically connected with the third photo diode 323 and the fourth photo diode 324.

The first to fourth partial DTIs 331 to 334 included in the second DTI 330 may be disposed to be spaced apart from the first DTI 335. The ground 346 may be electrically connected with all of the first to fourth photo diodes 320 to 324.

The first floating diffusion node 360 may be disposed between the first partial DTI 331 and the first DTI 335. The first floating diffusion node 360 may be electrically connected with the first photo diode 321 and the second photo diode 322 by using the transfer transistors 351 and 352.

Similarly, the third floating diffusion node 362 may be disposed between the third partial DTI 333 and the first DTI 335. The third floating diffusion node 362 may be electrically connected with the third photo diode 323 and the fourth photo diode 324 by using the transfer transistors 353 and 354.

The fourth pixel 412 may be formed substantially similarly as the third pixel 312. However, the present inventive concepts are not limited thereto.

Figure 12:
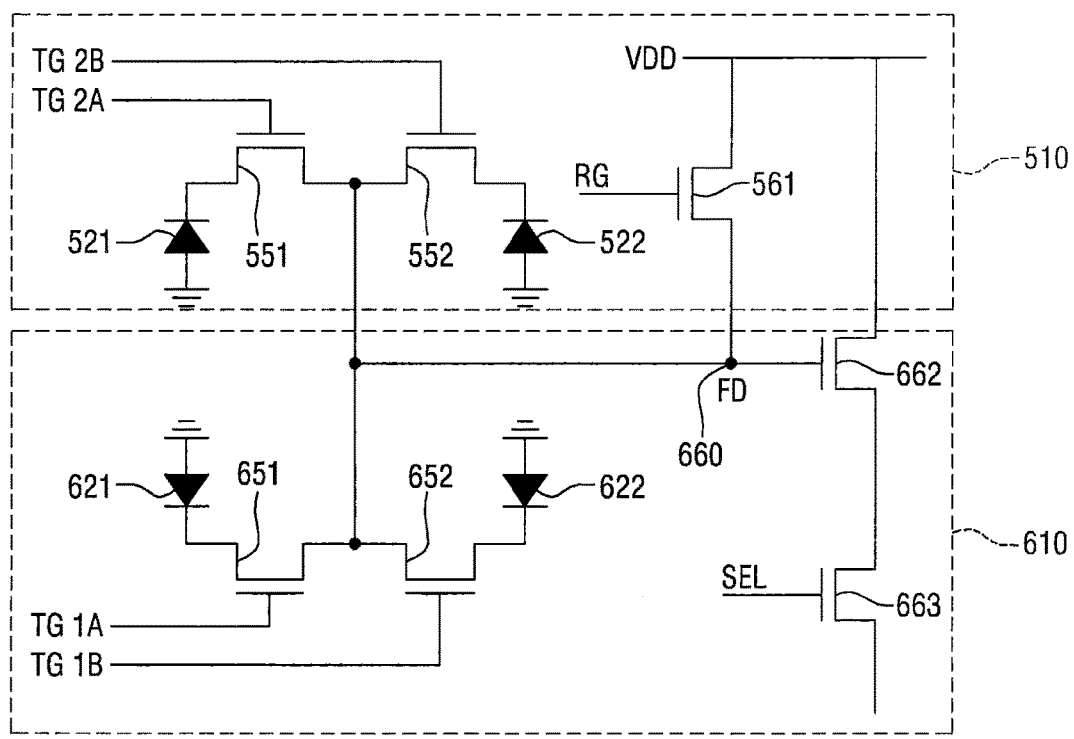
FIG. 12 is a diagram illustrating a circuit diagram for pixel arrays according to yet other embodiments of the present inventive concepts.
Figure 13:
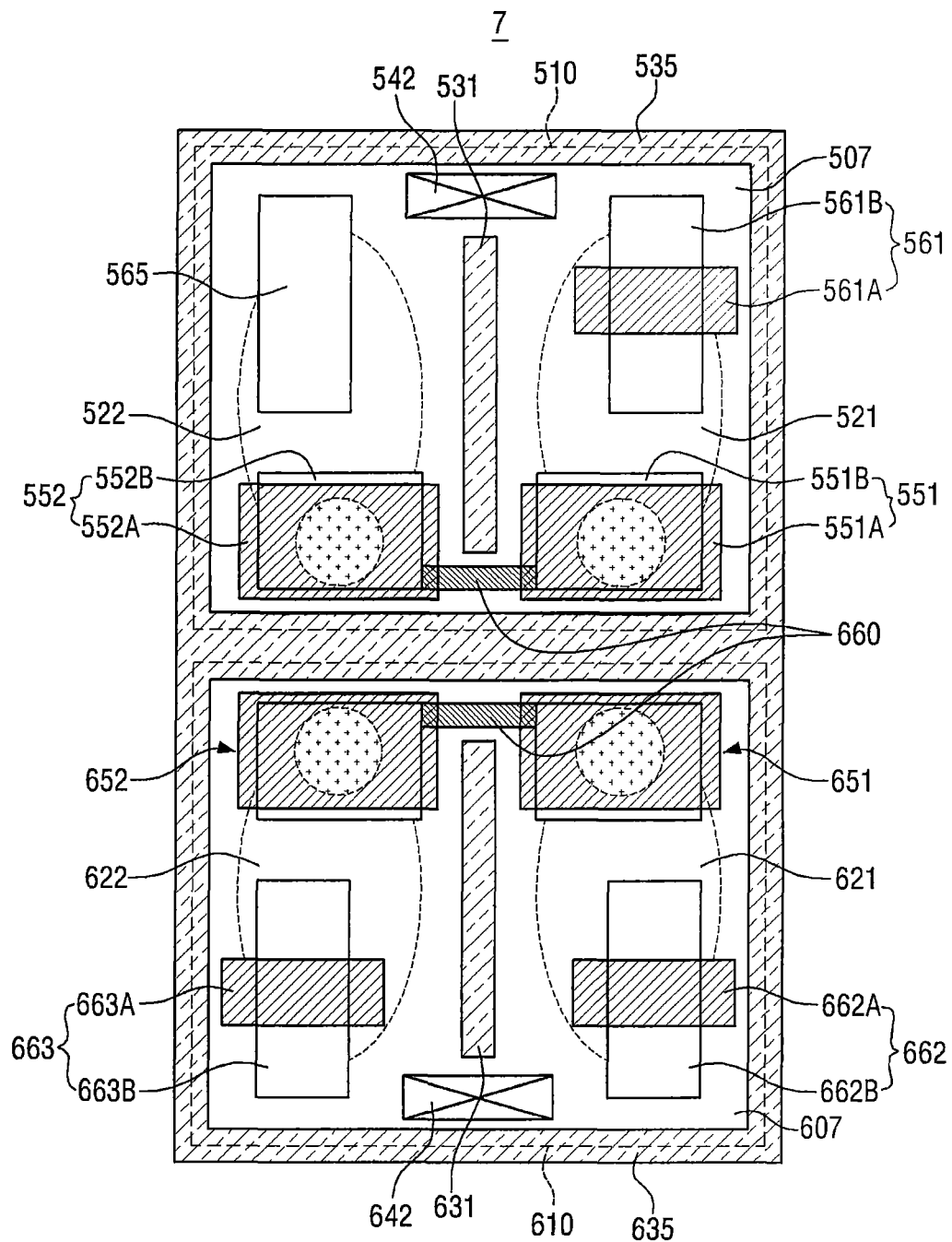
FIG. 13 is a diagram illustrating a layout for pixel arrays according to yet other embodiments of the present inventive concepts.

FIG. 12 is a diagram illustrating a circuit diagram for pixel arrays 7 according to other embodiments of the present inventive concepts. FIG. 13 is a diagram illustrating a layout for pixel arrays 7 according to other embodiments of the present inventive concepts. For easy description, hereinafter, a duplicated description of the same matter as the aforementioned embodiment will be omitted and a difference from the aforementioned embodiment will be primarily described.

Referring to FIGS. 12 to 13, pixel arrays 7 according to other embodiments of the present inventive concepts may include a first pixel 510 and a second pixel 610 having a structure in which two photo diodes are included in the unit pixel. The first pixel 510 and the second pixel 610 may be formed substantially similarly as the unit pixel 3 described with reference to FIG. 6.

The first pixel 510 may include first photo diodes 521 and 522, a first DTI 535, a second DTI 531, a first color filter, a first floating diffusion node 660, and first supplement transistors 551 and 552. Similarly, the second pixel 610 may include second photo diodes 621 and 622, a third DTI 635, a fourth DTI 631, a second color filter 413, a second floating diffusion node 660, and second supplement transistors 662 and 663.

The first photo diodes 521 and 522 may include two photo diodes 521 and 522. The first photo diodes 521 and 522 may be connected between transfer transistors 551 and 552 and a ground 542.

Similarly, the second photo diodes 621 and 622 may include two photo diodes 621 and 622. The second photo diodes 621 to 622 may be connected between transfer transistors 651 and 652 and a ground 642.

The transfer transistors 551, 552, 651 and 652 may transfer photo charges generated by the first and second photo diodes 521, 522, 621, and 622 to a gate terminal of a drive transistor 662 through the floating diffusion node 660.

A reset transistor 561 may apply a reset voltage to the gate terminal of the drive transistor 662. When the reset control signal RG is provided from the row driver 840 of FIG. 1, the reset transistor 561 may be turned on, and as a result, the output of the power supply terminal VDD may be provided to the gate terminal of the drive transistor 662. The reset transistor 561 may be included in the first pixel 510. However, the present inventive concepts are not limited thereto.

The drive transistor 662 may generate source-drain current in proportion to the intensity of the photo charge applied to the gate terminal. The select transistor 663 may transfer the current generated from the drive transistor 662 to the column line. The drive transistor 662 and the select transistor 663 may be included in the second pixel 610. However, the present inventive concepts are not limited thereto.

The first DTI 535 may fully surround the sides of the first pixel 510 and the second pixel 610, and may electrically separate the first pixel 510 and the second pixel 610.

The second DTI 531 may be disposed between the photo diodes 521 and 522, and one side or both sides of the second DTI 531 may be formed to be spaced apart from the first DTI 535. The floating diffusion node 660 or the ground 542 may be disposed in space by which the second DTI 531 and the first DTI 535 are spaced apart from each other. The second DTI 531 may be formed to be spaced apart from the floating diffusion node 660. However, the present inventive concepts are not limited thereto, and the second DTI 531 may be formed to contact the floating diffusion node 660. The first pixel 510 may be formed substantially similarly as the second pixel 610.

The plurality of photo diodes included in the pixels of each of the pixel arrays 5 to 7 described above may share a floating diffusion node. Therefore, the useful dimension of the unit pixels of the pixel array according to some embodiments of the present inventive concepts may be increased. In detail, when the plurality of photo diodes is included in one pixel, the DTI may be formed in a fully surrounding manner in order to reduce crosstalk among the plurality of photo diodes. However, when the DTI is formed in a fully surrounding manner for each photo diode, a contact connected to the floating diffusion node needs to be created for each photo diode. In contrast, when the DTI is disposed only partially among the plurality of photo diodes as described in some embodiments of the present inventive concepts, the floating diffusion node may be disposed in a unit pixel where the DTI is not disposed, and as a result, the plurality of photo diodes may share the floating diffusion node without using a separate contact. Therefore, the useful dimension of the unit pixels may be increased.

Figure 14:
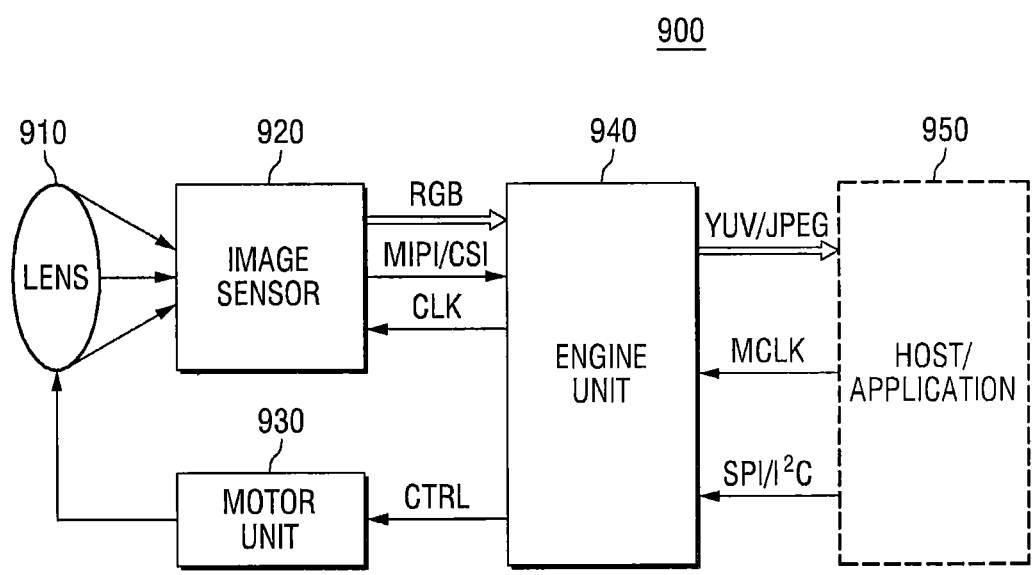
FIG. 14 is a block diagram of image capture devices according to other embodiments of the present inventive concepts.

FIG. 14 is a block diagram of image capture devices according to other embodiments of the present inventive concepts.

Referring to FIG. 14, image capture devices 900 according to other embodiments of the present inventive concepts may include a lens 910, an image sensor 920, a motor unit 930, and an engine unit 940. Herein, the image sensor 920 may include unit pixels 1 to 4 or pixel arrays 5 to 7 according to the embodiments of the present inventive concepts described above.

The lens 910 may gather incident light in a light-receiving area of the image sensor 920. The image sensor 920 may generate RGB data RGB of a Bayer pattern based on the light which is incident through the lens 910. The image sensor 920 may provide the RGB data RGB based on a clock signal CLK.

In some embodiments of the present inventive concepts, the image sensor 920 may interface with the engine unit 940 through a mobile industry processor interface (MIPI) and/or a camera serial interface (CSI).

The motor unit 930 may control a focus of the lens 910 in response to a control signal CTRL received from the engine unit 940 or may perform shuttering. The engine unit 940 may control the image sensor 920 and the motor unit 930. Further, the engine unit 940 may generate YUV data YUV including a luminance component, a difference between the luminance component and a blue component, and a difference between the luminance component and a red component or may generate compressed data, for example, Joint Photography Experts Group (JPEG) data based on the RGB data RGB received from the image sensor 920.

The engine unit 940 may be connected to a host/application 950, and the engine unit 940 may provide the YUV data YUV or the JPEG data based on a master clock MCLK from the host/application 950. Further, the engine unit 940 may interface with the host/application 950 through a serial peripheral interface (SPI) and/or an inter integrated circuit (I2C).

Figure 15:
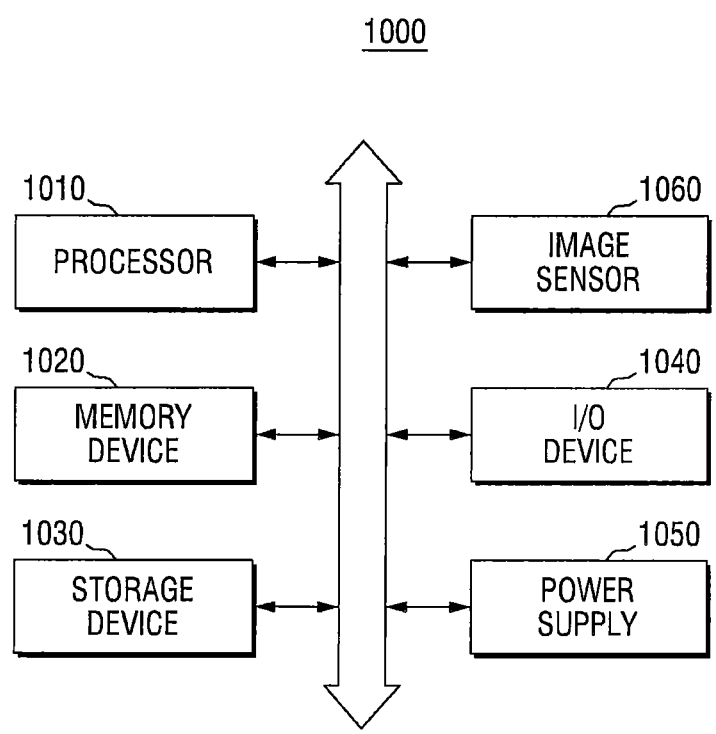
FIG. 15 is a block diagram illustrating an example in which image capture devices according to embodiments of the present inventive concepts are applied to a computing system.

FIG. 15 is a block diagram illustrating an example in which image capture devices according to the embodiments of the present inventive concepts are applied to a computing system.

Referring to FIG. 15, the computing system 1000 may include a processor 1010, a memory device 1020, a storage device 1030, an input/output device 1040, a power supply 1050, and an image sensor 1060.

Herein, as the image sensor 1060, the unit pixels 1 to 4 or the pixel arrays 5 to 7 according to the embodiments of the present inventive concepts described above may be used. Meanwhile, although not illustrated in FIG. 15, the computing system 1000 may further include ports which may communicate with a video card, a sound card, a memory card, a USB device, and the like or other electronic devices.

A processor 1010 may perform specific calculations or tasks. In some embodiments, the processor 1010 may be a micro-processor and a central processing unit (CPU).

The processor 1010 may communicate with a memory device 1020, a storage device 1030, and an input/output device 1040 through an address bus, a control bus, and/or a data bus.

In some embodiments, the processor 1010 may be connected to an extension bus such as a peripheral component interconnect (PCI) bus.

The memory device 1020 may store data required for operating the computing system 1000.

For example, the memory device 1020 may be implemented by a DRAM, a mobile DRAM, an SRAM, a PRAM, an FRAM, an RRAM, and/or an MRAM. The storage device 1030 may include a solid state drive (SSD), a hard disk drive (HDD), a CD-ROM, and the like.

The input/output device 1040 may include input means such as a keyboard, a keypad, a mouse, and the like, and output means such as a printer and a display. The power supply 1050 may supply operating voltage required for operating the electronic device 1000.

The image sensor 1060 may be connected to communicate with the processor 1010 through buses or other communication links. The image sensor 1060 may be integrated in one chip together with the processor 1010 or may be integrated in a different chip from the processor 1010.

Herein, the computing system 1000 may be analyzed as all computing systems using the image sensor. For example, the computing system 1000 may include a digital camera, a mobile phone, a personal digital assistant (PDA), a portable multimedia player (PMP), a smart phone, a tablet PC, and the like.

Further, in some embodiments of the present inventive concepts, the computing system 1000 may include an ultra mobile PC (UMPC), a workstation, a net-book, a portable computer, a wireless phone, a mobile phone, an e-book, a portable game machine, a navigation device, a black box, a 3-dimensional television, a digital audio recorder, a digital audio player, a digital picture recorder, a digital picture player, a digital video recorder, a digital video player, and the like.

Figure 16:
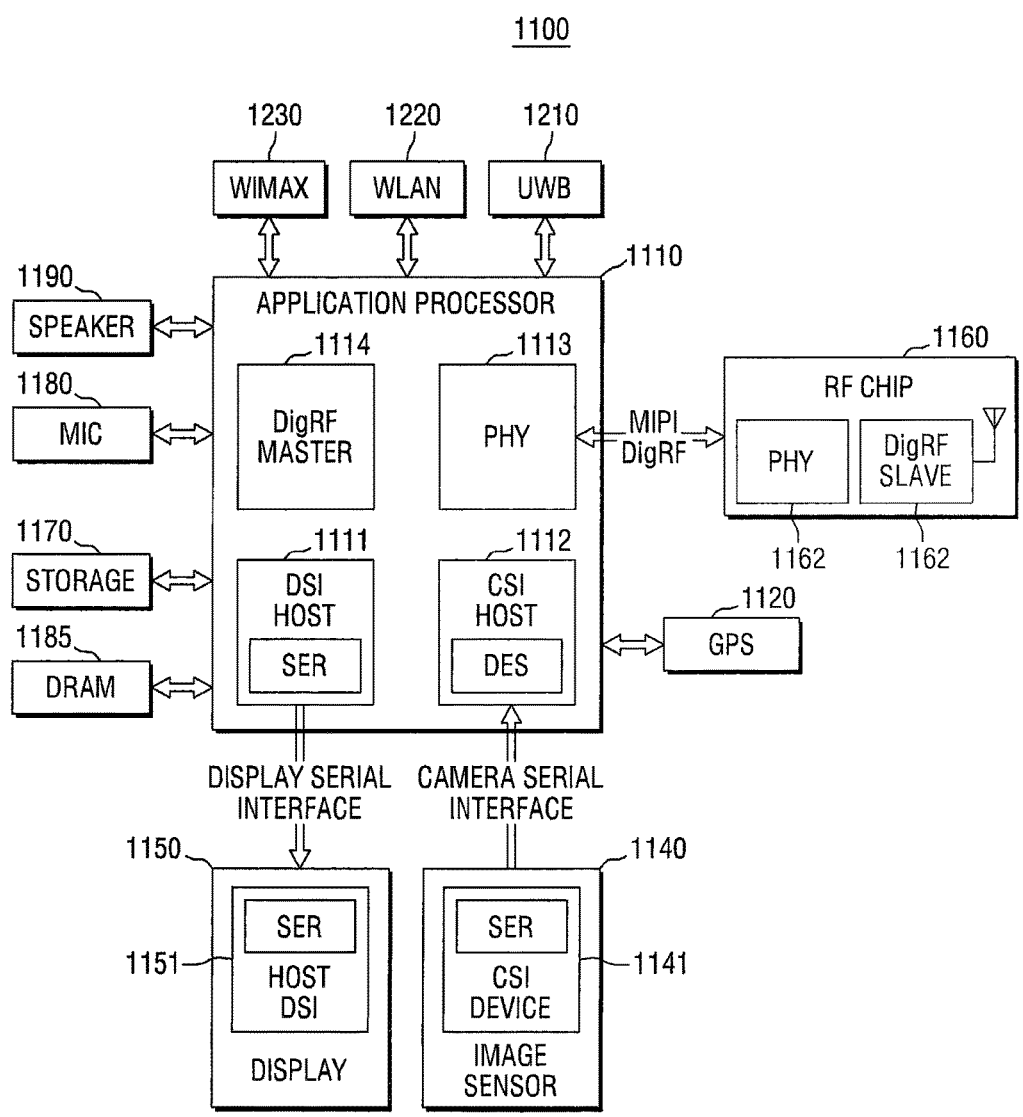
FIG. 16 is a block diagram illustrating an example of interfaces used in the computing system of FIG. 15.

FIG. 16 is a block diagram illustrating an example of interfaces used in the computing system 1000 of FIG. 15.

Referring to FIG. 16, computing systems 1100 may be implemented by a data processor capable of using or supporting an MIPI interface, and may include an application processor 1110, an image sensor 1140 and a display 1150.

A CSI host 1112 of the application processor 1110 may perform serial communication with a CSI device 1141 of the image sensor 1140 through a camera serial interface (CSI).

In some embodiments of the present inventive concepts, the CSI host 1112 may include a deserializer DES, and the CSI device 1141 may include a serializer SER. A DSI host 1111 of the application processor 1110 may perform serial communication with a DSI device 1151 of the display 1150 through a display serial interface (DSI).

In some embodiments of the present inventive concepts, the DSI host 1111 may include the serializer SER and the DSI device 1151 may include the deserializer DES. Moreover, the computing system 1100 may further include a radio frequency (RF) chip 1160 capable of communicating with the application processor 1110. A physical layer (PHY) 1113 of the computing system 1100 and a physical layer (PHY) 1161 of the RF chip 1160 may perform data transmission and reception according to a mobile industry processor interface (MIPI) DigRF.

Further, the application processor 1110 may further include a DigRF MASTER 1114 that controls data transmission and reception according to the MIPI DigRF of the physical layer (PHY) 1161. Meanwhile, the computing system 1100 may include a global positioning system (GPS) 1120, a storage 1170, a microphone 1180, a dynamic random access memory (DRAM) 1185, and a speaker 1190. Further, the computing system 1100 may perform communication by using an ultra wideband (UWB) 1210, a wireless local area network (WLAN) 1220, and a worldwide interoperability for microwave access (WIMAX) 1230. However, the structure and the interface of the computing system 1100 is one example and the present inventive concepts are not limited thereto.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific embodiments disclosed, and that modifications to the disclosed embodiments, as well as other embodiments, are intended to be included within the scope of the appended claims. The present inventive concepts are defined by the following claims, with equivalents of the claims to be included therein.

What is claimed is:

1. A unit pixel comprising:
   a first deep trench isolation (DTI); and
   a first pixel including:
      a first photo diode;
      a second photo diode;
         a second DTI positioned between the first photo diode and the second photo diode, the second DTI being separated from the first DTI;
         a color filter positioned on the first and second photo diodes and fully overlapping the first and second photo diodes; and a floating diffusion node electrically connected with the first and second photo diodes, the first and second photo diodes sharing the floating diffusion node, wherein the unit pixel comprises a first area and a second area, the first area and the second area being defined by the second DTI, wherein the first photo diode is disposed in the first area and the second photo diode is disposed in the second area, wherein the first pixel further comprises a third photo diode and a fourth photo diode, wherein the unit pixel further comprises a third area and a fourth area, the third area and the fourth area being defined by the second DTI, wherein the third photo diode is disposed in the third area and the fourth photo diode is disposed in the fourth area, and wherein the second DTI further comprises:
  a first partial DTI disposed between the first and second photo diodes in a first direction;
  a second partial DTI positioned between the third and fourth photo diodes and disposed in the first direction;
  a third partial DTI positioned between the first and third photo diodes and disposed in a second direction, the second direction being substantially perpendicular to the first direction; and
  a fourth partial DTI positioned between the second and fourth photo diodes and disposed in the second direction.

2. The unit pixel of claim 1, wherein each of the first to fourth partial DTIs is separated from the first DTI and from the floating diffusion node, and
  the floating diffusion node is disposed at the center of the first pixel and electrically connected with all of the first to fourth photo diodes.

3. The unit pixel of claim 1, wherein each of the first to fourth partial DTIs is separated from the floating diffusion node that is positioned at the center of the first pixel.

4. The unit pixel of claim 1, wherein the color filter is configured to selectively transmit light having a specific wavelength.

5. The unit pixel of claim 4, wherein the color filter is configured to selectively transmit red light, green light, blue light, magenta light, yellow light, or cyan light.

6. The unit pixel of claim 1, further comprising:
  first supplement transistor electrically connected to the floating diffusion node; and
  a second supplement transistor.

7. The unit pixel of claim 6, wherein the first supplement transistor is a reset transistor configured to reset the floating diffusion node according to a reset control signal.

8. The unit pixel of claim 6, wherein the first supplement transistor is a drive transistor configured to output a voltage signal corresponding to potential of the floating diffusion node to a source terminal, and
  the second supplement transistor is a select transistor configured to output the voltage signal to a column line according to a selection control signal.

9. A unit pixel comprising:
a first deep trench isolation (DTI); and
a first pixel including:
  a first photo diode;
  a second photo diode;
  a second DTI positioned between the first photo diode and the second photo diode, the second DTI being separated from the first DTI;
  a color filter positioned on the first and second photo diodes and fully overlapping the first and second photo diodes; and
  a floating diffusion node electrically connected with the first and second photo diodes, the first and second photo diodes sharing the floating diffusion node, wherein the unit pixel comprises a first area and a second area, the first area and the second area being defined by the second DTI, wherein the first photo diode is disposed in the first area and the second photo diode is disposed in the second area, wherein the first pixel further comprises a ground positioned between one side of the second DTI and the first DTI and electrically connected with the first and second photo diodes, and wherein the floating diffusion node is disposed between the other side of the second DTI and the first DTI.

10. The unit pixel of claim 9, further comprising:
an anti-reflection layer disposed between the first and second photo diodes and the color filter; and
a micro lens contacting one surface of the color filter and fully overlapping the first and second photo diodes.

11. The unit pixel of claim 9, wherein the first and second DTIs surround sides of the first and second photo diodes and contact the top of the color filter.

12. The unit pixel of claim 9, wherein the color filter is configured to selectively transmit light having a specific wavelength.

13. The unit pixel of claim 12, wherein the color filter is configured to selectively transmit red light, green light, blue light, magenta light, yellow light, or cyan light.

14. The unit pixel of claim 9, further comprising:
a first supplement transistor electrically connected to the floating diffusion node; and
a second supplement transistor.

15. An image sensor comprising:
a timing generator configured to generate a timing signal and a control signal;
a row decoder;
an analog to digital converter (ADC) configured to convert an analog signal into a digital signal and to output the converted digital signal;
a latch configured to latch the digital signal;
a column decoder; and
a plurality of unit pixels including a first pixel and a second pixel,
wherein the first pixel comprises:
  a first photo diode;
  a second photo diode;
  a first deep trench isolation (DTI) fully surrounding the first pixel and electrically separating the first pixel and the second pixel;
  a second DTI positioned between the first photo diode and the second photo diode, the second DTI being separated from the first DTI;
  a first color filter positioned on the first and second photo diodes and fully overlapping the first and second photo diodes;
  a first floating diffusion node electrically connected with the first and second photo diodes; and
  a first supplement transistor electrically connected to the first floating diffusion node, and wherein the second pixel comprises:
a third photo diode;
a fourth photo diode;
a third DTI fully surrounding the second pixel and electrically separating the first pixel and the second pixel;
a fourth DTI positioned between the third photo diode and the fourth photo diode, the fourth DTI being separated from the third DTI;
a second color filter positioned on the third and fourth photo diodes and fully overlapping the third and fourth photo diodes, the second color filter having a different color from the first color filter;
a second floating diffusion node electrically connected with the third and fourth photo diodes, and the first floating diffusion node; and
a second supplement transistor electrically connected to the second floating diffusion node.

16. The image sensor of claim 15, wherein the first floating diffusion node is disposed between one side of the second DTI and the first DTI, and
the second floating diffusion node is disposed between one side of the fourth DTI and the third DTI.

17. The image sensor of claim 15, wherein the first supplement transistor comprises a drive transistor or a select transistor,
the second supplement transistor comprises a dummy transistor or a reset transistor,
the drive transistor is configured to output a voltage signal corresponding to potential of the first floating diffusion node to a source terminal,
the select transistor is configured to output the voltage signal to a column line according to a selection control signal, and
the reset transistor is configured to reset the first and second floating diffusion nodes according to a reset control signal.

18. The image sensor of claim 15, wherein the first pixel further comprises a fifth photo diode and a sixth photo diode.

19. The image sensor of claim 18, wherein the first floating diffusion node is disposed at the center of the first pixel and electrically connected with the first, second, fifth, and sixth photo diodes.

* * * * *